(12) United States Patent
Ito et al.

(10) Patent No.: US 11,393,905 B2
(45) Date of Patent: Jul. 19, 2022

(54) NITRIDE SEMICONDUCTOR DEVICE

(71) Applicant: ROHM CO., LTD., Kyoto (JP)

(72) Inventors: Norikazu Ito, Kyoto (JP); Taketoshi Tanaka, Kyoto (JP); Ken Nakahara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 44 days.

(21) Appl. No.: 16/958,090

(22) PCT Filed: Dec. 21, 2018

(86) PCT No.: PCT/JP2018/047351
§ 371 (c)(1),
(2) Date: Jun. 25, 2020

(87) PCT Pub. No.: WO2019/131546
PCT Pub. Date: Jul. 4, 2019

(65) Prior Publication Data
US 2020/0365694 A1 Nov. 19, 2020

(30) Foreign Application Priority Data
Dec. 28, 2017 (JP) .............................. JP2017-253202

(51) Int. Cl.
*H01L 29/778* (2006.01)
*H01L 29/20* (2006.01)
*H01L 29/66* (2006.01)

(52) U.S. Cl.
CPC .... *H01L 29/2003* (2013.01); *H01L 29/66462* (2013.01); *H01L 29/7786* (2013.01); *H01L 29/7787* (2013.01)

(58) Field of Classification Search
None
See application file for complete search history.

(56) References Cited

U.S. PATENT DOCUMENTS

| 2002/0096692 A1 | 7/2002 | Nakamura et al. |
| 2005/0087751 A1 | 4/2005 | Nakamura et al. |

(Continued)

FOREIGN PATENT DOCUMENTS

| JP | 2002057158 | 2/2002 |
| JP | 2013123047 | 6/2013 |

(Continued)

OTHER PUBLICATIONS

International Search Report and Written Opinion issued for International Patent Application No. PCT/JP2018/047351, dated Mar. 26, 2019, 9 pages including English translation of Search Report.

(Continued)

*Primary Examiner* — Grant S Withers
(74) *Attorney, Agent, or Firm* — Hamre, Schumann, Mueller & Larson, P.C.

(57) ABSTRACT

A nitride semiconductor device includes a first impurity layer made of an $Al_{1-X}Ga_XN$ (0<X≤1) based material and containing a first impurity with which a depth of an acceptor level from a valence band ($E_T$-$E_V$) is made not less than 0.3 eV but less than 0.6 eV, an electron transit layer formed on the first impurity layer, an electron supply layer formed on the electron transit layer, agate electrode formed on the electron transit layer, and a source electrode and a drain electrode formed such that the source electrode and the drain electrode sandwich the gate electrode and electrically connected to the electron supply layer.

18 Claims, 27 Drawing Sheets

(56) References Cited

U.S. PATENT DOCUMENTS

| | | | |
|---|---|---|---|
| 2013/0153923 A1 | 6/2013 | Decoutere et al. | |
| 2014/0159119 A1* | 6/2014 | Derluyn | H01L 29/7786 |
| | | | 257/194 |
| 2014/0252368 A1* | 9/2014 | Lee | H01L 29/4175 |
| | | | 257/76 |
| 2014/0264274 A1* | 9/2014 | Nakayama | H01L 29/7787 |
| | | | 257/20 |
| 2015/0318374 A1 | 11/2015 | Decoutere | |
| 2016/0043209 A1 | 2/2016 | Oyama | |
| 2016/0064539 A1 | 3/2016 | Lu et al. | |
| 2016/0293709 A1* | 10/2016 | Nakayama | H01L 29/66446 |

FOREIGN PATENT DOCUMENTS

| | | |
|---|---|---|
| JP | 2014110345 | 6/2014 |
| JP | 2014207287 | 10/2014 |
| JP | 2015536570 | 12/2015 |

OTHER PUBLICATIONS

International Preliminary Report on Patentability issued for International Patent Application No. PCT/JP2018/047351, dated Jul. 9, 2020, 13 pages including English translation.

\* cited by examiner

NITRIDE SEMICONDUCTOR DEVICE

TECHNICAL FIELD

The present invention relates to a nitride semiconductor device.

BACKGROUND ART

For example, Patent Literature 1 discloses an HEMT that includes a supporting substrate, a buffer layer on the supporting layer, an electron transit layer on the buffer layer, an electron supply layer on the electron transit layer, a gate recess formed in the electron supply layer and reaching the electron transit layer, an insulating film formed on a wall surface of the gate recess and on the electron supply layer, a gate electrode embedded on the insulating film, and a source electrode and a drain electrode formed to be in ohmic contact with the electron supply layer and electrically connected to a two-dimensional electron gas layer via the electron supply layer.

CITATION LIST

Patent Literature

Patent Literature 1: Japanese Patent Application Publication No. 2014-207287

SUMMARY OF INVENTION

Technical Problem

For example, in a normally-off type HEMT device, it is preferable for a gate threshold voltage not to be excessively low in order to achieve reliable normally-off operation. In regard to this point, doping a semiconductor layer with an impurity that functions as an acceptor is being examined to increase the gate threshold voltage. For example, C (carbon) and Fe (iron) are cited as acceptors that can be used in a GaN based device.

However, C and Fe form deep levels in a GaN layer such that responsiveness to gate voltage is not high and cause threshold shift (Vth shift) or current collapse in some cases.

A preferred embodiment of the present invention provides a nitride semiconductor device with which a gate threshold voltage can be made comparatively high to enable satisfactory normally-off operation to be achieved and with which satisfactory responsiveness with respect to gate voltage can be achieved.

Solution to Problem

A preferred embodiment of the present invention provides a nitride semiconductor device including a first impurity layer made of an $Al_{1-X}Ga_XN$ $(0<X\leq 1)$ based material and containing a first impurity with which a depth of an acceptor level from a valence band $(E_T-E_V)$ is made not less than 0.3 eV but less than 0.6 eV, an electron transit layer formed on the first impurity layer, an electron supply layer formed on the electron transit layer, a gate electrode formed on the electron transit layer, and a source electrode and a drain electrode formed such that the source electrode and a drain electrode sandwich the gate electrode and electrically connected to the electron supply layer.

DESCRIPTION OF EMBODIMENTS

Preferred embodiments of the present invention shall now be described in detail with reference to the attached drawings.

Figure 1:
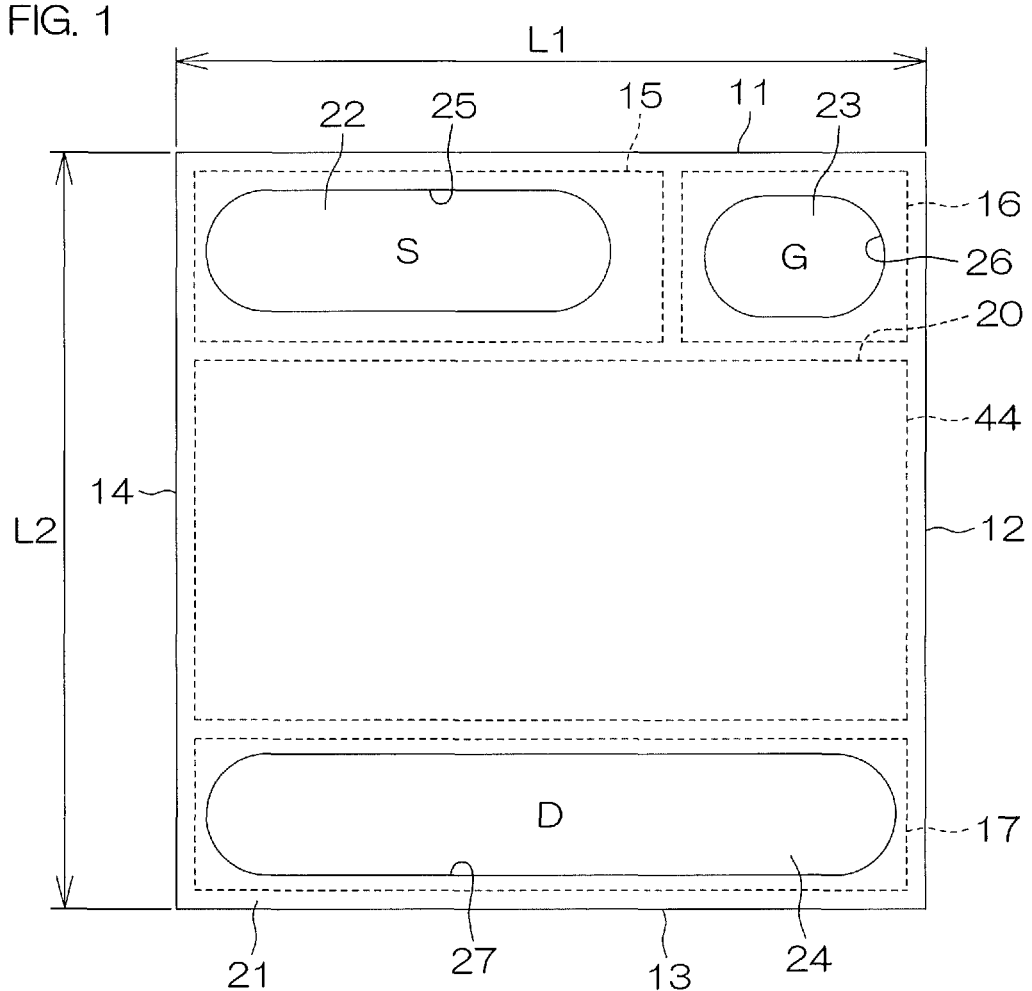
FIG. 1 is a schematic plan view of a nitride semiconductor device according to a preferred embodiment of the present invention.
Figure 2:
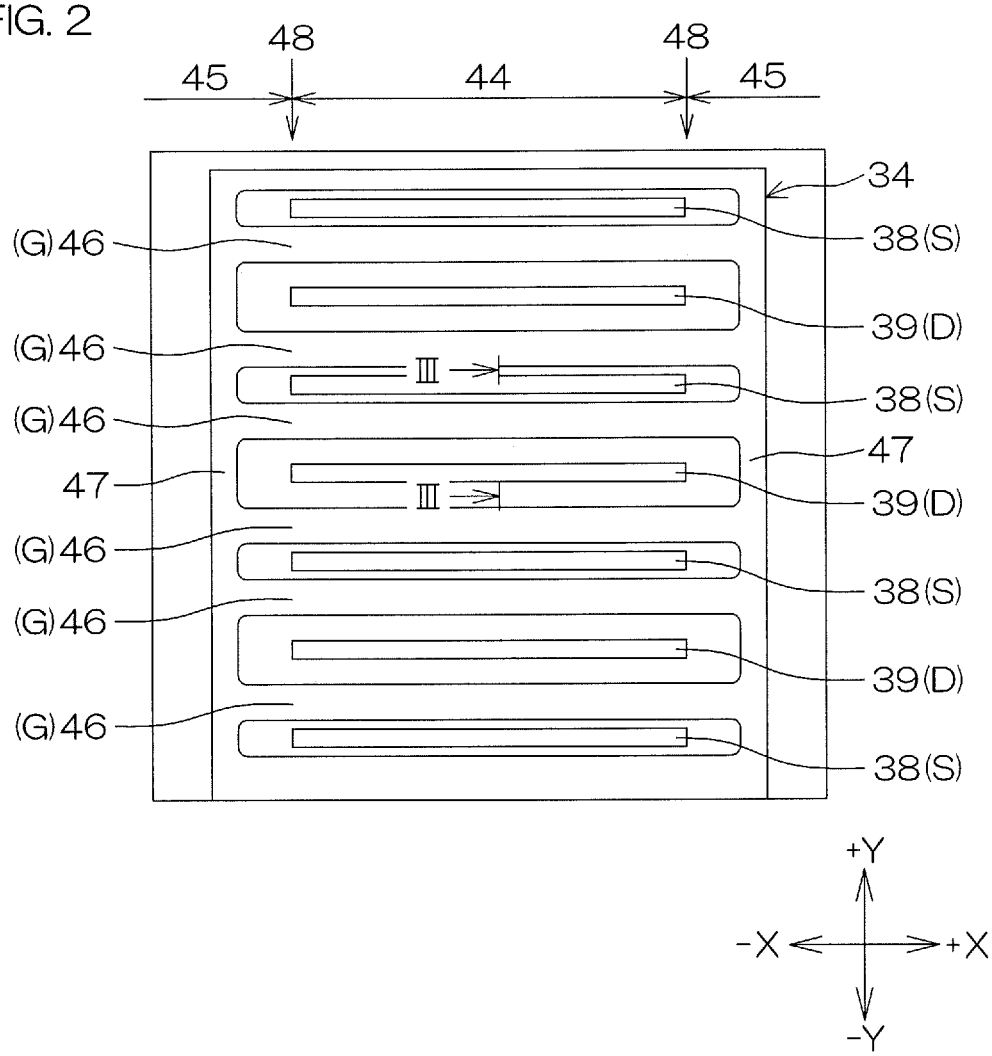
FIG. 2 is a schematic plan view of an internal structure of the nitride semiconductor device of FIG. 1.
Figure 3:
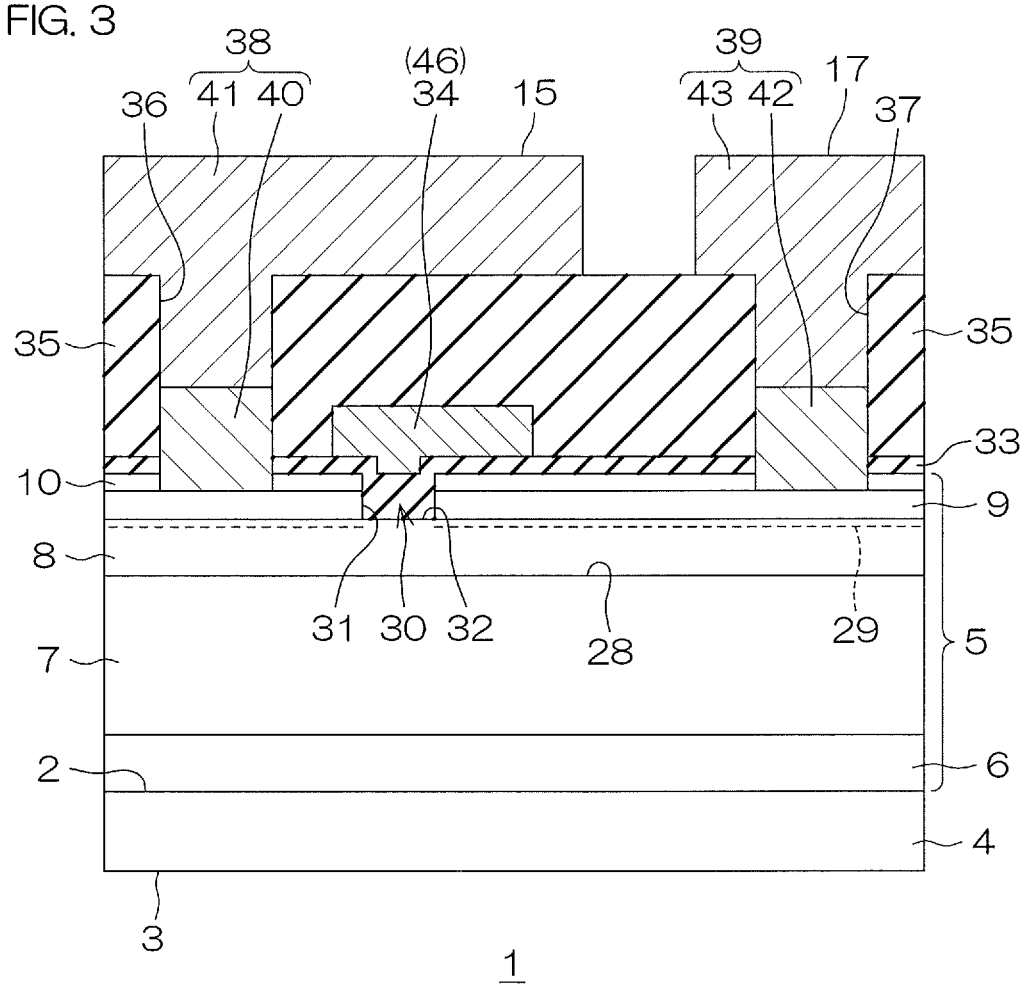
FIG. 3 is a diagram of a cross section taken along III-III of FIG. 2.
Figure 4:
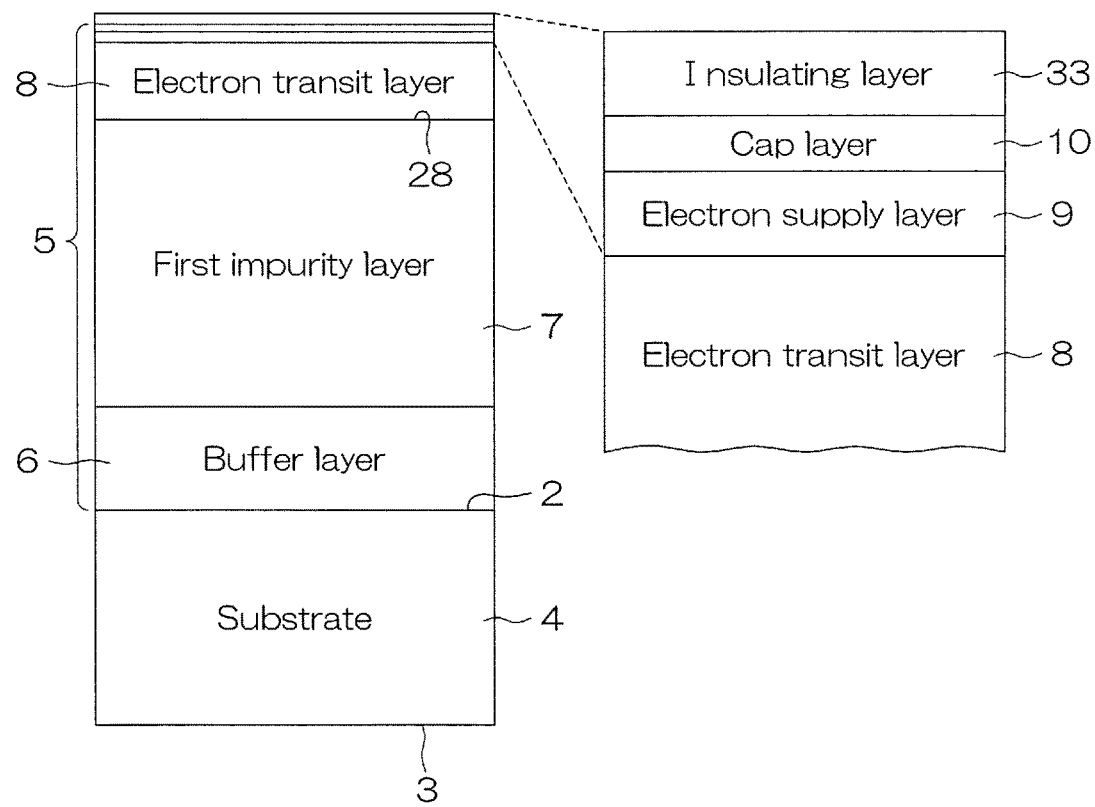
FIG. 4 is a schematic diagram of a layer arrangement of a semiconductor laminated structure of FIG. 3.

FIG. 1 is a schematic plan view of a nitride semiconductor device 1 according to a preferred embodiment of the present invention. FIG. 2 is a schematic plan view of an internal structure of the nitride semiconductor device 1 of FIG. 1. FIG. 3 is a diagram of a cross section taken along III-III of FIG. 2. FIG. 4 is a schematic diagram of a layer arrangement of a semiconductor laminated structure 5 of FIG. 3. In FIG. 4, a front surface insulating film 21 is omitted from illustration.

The nitride semiconductor device 1 may be a chip formed to a quadrilateral shape in plan view as shown in FIG. 1. In the present preferred embodiment, the nitride semiconductor device 1 is formed to a square shape in plan view and, for example, has a first side 11, a second side 12, a third side 13, and a fourth side 14 successively in a clockwise direction.

A length L1 of the first side 11 and the third side 13 of the nitride semiconductor device 1 may, for example, be 0.5 mm to 10 mm, and a length L2 of the second side 12 and the fourth side 14 may, for example, be 0.5 mm to 10 mm.

An active region 44 is formed in a substantially central portion of the nitride semiconductor device 1. As shown in FIG. 2, the active region 44 has a structure where units, with one unit being a set of a gate electrode 34 and a source electrode 38 and a drain electrode 39 formed such that the source electrode 38 and the drain electrode 39 sandwich the gate electrode 34 from both sides, are aligned in parallel to each other.

More specifically, the source electrodes 38 and the drain electrodes 39 extend in an X direction. The gate electrode 34 includes a plurality of electrode portions 46 extending in the X direction in parallel to each other and two base portions 47 each coupling corresponding end portions of the plurality of electrode portions 46 to each other.

In the example of FIG. 2, the source electrodes 38 (S), the electrode portions 46 (G) of the gate electrode 34, and the drain electrodes 39 (D) are formed periodically in an order DGSGDGS in the Y direction. Thereby, element structures are arranged by the source electrodes 38 (S) and the drain electrodes 39 (D) sandwiching the electrode portions 46 (G) of the gate electrode 34. A region of a front surface on the semiconductor laminated structure 5 is made of the active region 44 that includes the element structures and nonactive regions 45 besides the active region 44. In FIG. 2, the symbol 48 indicates isolation lines that are boundary lines between the active region 44 and the nonactive regions 45. Each base portion 47 of the gate electrode 34 couples the corresponding end portions of the plurality of electrode portions 46 to each other in each nonactive region 45.

In the present preferred embodiment, the active region 44 is formed to a rectangular shape in plan view having a width of magnitude substantially equivalent to the length L1 of the first side 11.

A source electrode film 15, a gate electrode film 16, and a drain electrode film 17 are formed as electrodes led out from the source electrodes 38, the drain electrodes 39, and the gate electrode 34 of the respective units of the active region 44. As the source electrode film 15, the gate electrode film 16, and the drain electrode film 17, for example, metal films, such as Al films, etc., can be applied. The source electrode film 15, the gate electrode film 16, and the drain electrode film 17 may respectively be referred to as a source metal, a gate metal, and a drain metal based on a constituent material or may be referred to simply as a source electrode, a gate electrode, and a drain electrode based on functional aspects.

The source electrode film 15 is formed at the first side 11 side with respect to the active region 44. In the present preferred embodiment, the source electrode film 15 is formed to a rectangular shape in plan view having a narrower width than the active region 44.

A region 20 made of a step formed by a difference in width between the active region 44 and the source electrode film 15 is formed in a region on the nitride semiconductor device 1. As shown in FIG. 1, the region 20 may be formed in an intersection portion of the first side 11 and the second side 12 of the nitride semiconductor device 1.

The gate electrode film 16 is formed in the region 20 formed by the step between the active region 44 and the source electrode film 15 (the intersection portion of the first side 11 and the second side 12 of the nitride semiconductor device 1 in the present preferred embodiment) and is formed to a quadrilateral shape in plan view.

The drain electrode film 17 is formed between the active region 44 and the third side 13 of the nitride semiconductor device 1 and is formed to a rectangular shape in plan view having a width of magnitude substantially equivalent to the length L1 of the first side 11. That is, the drain electrode film 17 may be formed to a rectangular shape that is long in a direction along the first side 11 and the third side 13.

The source electrode film 15, the gate electrode film 16, and the drain electrode film 17 are covered by the front surface insulating film 21. As the front surface insulating film 21, for example, SiN, etc., can be applied. Openings 25, 26, and 27 exposing portions of the source electrode film 15, the gate electrode film 16, and the drain electrode film 17 respectively as a source pad 22, a gate pad 23, and a drain pad 24 are formed in the front surface insulating film 21.

The source pad 22 is formed, for example, in a substantially elliptical shape oriented along the first side 11 of the nitride semiconductor device 1 in a vicinity of the first side 11. As shown in FIG. 1, the source pad 22 of substantially elliptical shape may be of a shape that includes a pair of straight lines oriented along the first side 11 and facing each other in a direction intersecting the first side 11 and semicircles joining respective end portions of the pair of sides to each other.

The gate pad 23 is formed along the first side 11 of the nitride semiconductor device 1 and at an interval from the source pad 22. That is, the source pad 22 and the gate pad 23 may be juxtaposed along the first side 11 of the nitride semiconductor device 1. Also, in regard to shape, the gate pad 23 may be of a substantially elliptical shape oriented along the first side 11 like the source pad 22.

The drain pad 24 is formed, for example, in a substantially elliptical shape oriented along the third side 13 of the nitride semiconductor device 1 in a vicinity of the third side 13. As shown in FIG. 1, the drain pad 24 of substantially elliptical shape may be of a shape that includes a pair of straight lines oriented along the third side 13 and facing each other in a direction intersecting the third side 13 and semicircles joining respective end portions of the pair of sides to each other. In the present preferred embodiment, a length of the pair of straight lines may be of a magnitude substantially equivalent to the length L1 of the first side 11 of the nitride semiconductor device 1. In this case, the drain pad 24 may face both the source pad 22 and the gate pad 23 in the direction intersecting the first side 11.

In regard to the shape, configuration, number, etc., of the source pad 22, the gate pad 23, and the drain pad 24, the example described above is merely one example and these may be changed as appropriate according to design.

Next, in regard to cross-sectional structure, the nitride semiconductor device 1 includes a substrate 4 having a first surface 2 and a second surface 3 at a side opposite to the first surface 2 and the semiconductor laminated structure 5 formed on the first surface 2 of the substrate 4 as shown in FIG. 3 and FIG. 4.

As the substrate 4, for example, an insulating substrate such as a sapphire substrate, etc., or a semiconductor substrate such as an Si substrate, an SiC substrate, a GaN substrate, etc., can be applied. Also, a thickness of the substrate 4 may, for example, be 400 μm to 1000 μm. Here, the first surface 2 and the second surface 3 of the substrate 4 may be referred to respectively as a front surface and a rear surface of the substrate 4. Also, the second surface 3 of the substrate 4 may be an exposed surface on which a structure such as an electrode, a semiconductor laminated structure, etc., is not formed.

The semiconductor laminated structure 5 is a laminated structure arranged from a plurality of semiconductor layers made of mutually different compositions. In the present preferred embodiment, the semiconductor laminated structure 5 includes a buffer layer 6, a first impurity layer 7, an electron transit layer 8, an electron supply layer 9, and a cap layer 10 in an order from a side close to the first surface 2 of the substrate 4. The layers 6 to 10 may be formed by epitaxially growing raw materials on the first surface 2 of the substrate 4.

As the buffer layer 6, there is no restriction in particular as long as it is one that is capable, for example, of relaxing lattice mismatch of the electron transit layer 8 with respect to the substrate 4. For example, if the substrate 4 is a Si substrate and the electron transit layer 8 is a GaN layer, the buffer layer 6 may be an AlGaN layer or may be a layer having a superlattice structure in which an AlN layer and a GaN layer are laminated repeatedly. Also, a thickness of the buffer layer 6 may, for example, be 0.1 μm to 2 μm.

The first impurity layer 7 is made of an $Al_{1-X}Ga_XN$ (0<X≤1) based material and may, for example, be a GaN layer or an AlGaN layer. Also, the first impurity layer 7 contains a first impurity with which a depth of an acceptor level from a valence band $(E_T-E_V)$ is made not less than 0.3 eV but less than 0.6 eV. As such an impurity, for example, Zn, etc., can be applied. If the first impurity layer 7 contains Zn, its concentration may, for example, be $5×10^{17}$ cm$^{-3}$ to $5×10^{19}$ cm$^{-3}$. On the other hand, the first impurity layer 7 may contain, for example, C at a concentration of less than $5×10^{17}$ cm$^{-3}$.

That is, the first impurity layer 7 contains Zn at a concentration of not less than one order of magnitude greater in comparison to C. This concentration difference is due, for example, to Zn being doped intentionally as the impurity in the first impurity layer 7 in a crystal growing process of the first impurity layer 7 and on the other hand C being mixed unintentionally in the crystal growing process. Therefore, although C can function as an acceptor in GaN, it does not function as an acceptor in the first impurity layer 7 based on the above concentration difference.

Also, a thickness of the first impurity layer 7 may, for example, be 0.5 μm to 5 μm. Also, the first impurity layer 7 may have a function of being capable of relaxing the lattice mismatch of the electron transit layer 8 with respect to the substrate 4 and in this case, it may be referred to as a second buffer layer between the buffer layer 6 in contact with the substrate 4 and the electron transit layer 8.

As the electron transit layer 8, for example, a nitride semiconductor that is undoped can be applied and specifically, it may be a layer made of an $Al_{1-X}Ga_XN$ (0<X≤1) based material that is undoped. A nitride semiconductor layer that is undoped signifies, for example, a semiconductor layer that is formed without doping an impurity intentionally in a crystal growing process of the electron transit layer 8, and as with the C in the first impurity layer 7 mentioned above, several types of other elements besides the Al, Ga, and N that form the electron transit layer 8 may be mixed in unintentionally.

For example, the Zn contained in the first impurity layer 7 that contacts the electron transit layer 8 may be contained in a region of the electron transit layer 8 in a vicinity of the first impurity layer 7. In this case, the concentration of the Zn in the electron transit layer 8 may be decreased by one order of magnitude with respect to the Zn concentration of the first impurity layer 7 at a thickness of not less than 0.05 μm to the electron transit layer 8 side from an interface 28 between the first impurity layer 7 and the electron transit layer 8. For example, if the Zn concentration at the interface 28 is $5×10^{17}$ cm$^{-3}$, the Zn concentration at a depth position of 0.05 μm to the electron transit layer 8 side from the interface 28 may be not more than $5×10^{16}$ cm$^{-3}$.

Also, a thickness of the electron transit layer 8 may be not more than 0.3 μm and not less than 0.01 μm. Also, the electron transit layer 8 is a layer in which a two-dimensional electron gas 29 to be described below is formed and is a layer in which channels of the nitride semiconductor device 1 are formed and may therefore be referred to as a channel layer.

As the electron supply layer 9, for example, a layer made of an $Al_{1-X}Ga_XN$ (0≤X<1) based material differing in Al composition from the electron transit layer 8 can be applied. For example, the electron transit layer 8 may be a GaN layer and the electron supply layer 9 may be an AlN layer. Also, a thickness of the electron supply layer 9 may, for example, be 1 nm to 5 nm if the electron supply layer 9 is AlN and may be 10 nm to 100 nm if the electron supply layer 9 is $Al_{1-X}Ga_XN$ (0<X<1). Here, the electron supply layer 9 may be referred to as a barrier layer.

The electron transit layer 8 and the electron supply layer 9 are thus made of nitride semiconductors differing in Al composition and lattice mismatch occurs between the two. Also, because of polarization due to the lattice mismatch, the two-dimensional electron gas 29 due to the polarization spreads at a position close to an interface between the electron transit layer 8 and the electron supply layer 9 (for example, a position of a distance of approximately several Å from the interface).

The cap layer 10 is formed on the electron supply layer 9, for example, to suppress oxidation of the electron supply layer 9 and may be made of a nitride semiconductor layer of a composition that does not contain Al. For example, the cap layer 10 may be made of a GaN layer. Also, a thickness of the cap layer 10 may, for example, be 0.5 nm to 10 nm.

The semiconductor laminated structure 5 has formed therein recesses 30 dug in from its front surface toward the electron transit layer 8. Each recess 30 has a wall surface 31 extending over the cap layer 10 and the electron supply layer 9 and a bottom surface 32 made of the electron transit layer 8. The interface between the electron supply layer 9 and the electron transit layer 8 is not present in the recesses 30 and therefore a distribution region of the two-dimensional electron gas 29 is divided with the recesses 30 as boundaries. Normally-off operation of the nitride semiconductor device 1 is thereby achieved.

Also, an insulating layer 33 is formed such that the insulating layer 33 covers the wall surfaces 31 and the bottom surfaces 32 of the recesses 30 and the gate electrode 34 is formed on the insulating layer 33. The gate electrode 34 is formed such that the gate electrode 34 faces the electron transit layer 8 exposed as the bottom surfaces 32 of the recesses 30. A portion of the gate electrode 34 is exposed as the gate electrode film 16 mentioned above at an unillustrated position.

Also, the gate electrode 34 is formed biasedly toward the drain electrode 39 (to be described later) with respect to each recess 30 and an asymmetrical structure where a gate-drain distance is made longer than a gate-source distance is thereby arranged. The asymmetrical structure relaxes a high electric field generated across gate and drain and contributes to improvement of withstand voltage.

As the insulating layer 33, for example, SiN, etc., can be applied, and as the gate electrode 34, for example, TiN, etc., can be applied. Also, a thickness of the insulating layer 33 may, for example, be 10 nm to 100 nm, and a thickness of the gate electrode 34 may, for example, be 50 nm to 200 nm. Here, the insulating layer 33 may be referred to as a gate insulating film.

On the semiconductor laminated structure 5, a second insulating layer 35 is formed such that the second insulating layer 35 covers the gate electrode 34. As the second insulating layer 35, for example, $SiO_2$, etc., can be applied. Also, a thickness of the second insulating layer 35 may, for example, be 500 nm to 3 μm. Here, the second insulating layer 35 may be referred to as an interlayer insulating film.

Source contact holes 36 and drain contact holes 37 penetrating through the second insulating layer 35, the insulating layer 33, and the cap layer 10 and reaching the electron supply layer 9 are formed from a front surface of the second insulating layer 35. The source electrodes 38 and the drain electrodes 39 are respectively embedded in the source contact holes 36 and the drain contact holes 37.

Each source electrode 38 may, for example, have a lower layer 40 in ohmic contact with the electron supply layer 9 and an upper layer 41 laminated on the lower layer 40. The lower layer 40 may be Ti and the upper layer 41 may be an Al layer. An interface between the upper layer 41 and the lower layer 40 is positioned in an intermediate position in a depth direction of the source contact hole 36. Also, a portion of the upper layer 41 outside the source contact hole 36 is exposed as the source electrode film 15 mentioned above.

Each drain electrode 39 may, for example, have a lower layer 42 in ohmic contact with the electron supply layer 9 and an upper layer 43 laminated on the lower layer 42. The lower layer 42 may be Ti and the upper layer 43 may be an Al layer. An interface between the upper layer 43 and the lower layer 42 is positioned in an intermediate position in a depth direction of the drain contact hole 37. Also, a portion of the upper layer 43 outside the drain contact hole 37 is exposed as the drain electrode film 17 mentioned above.

Next, an effect of introducing the first impurity layer 7 shall be described with reference to FIG. 5 to FIG. 8.

Figure 5:
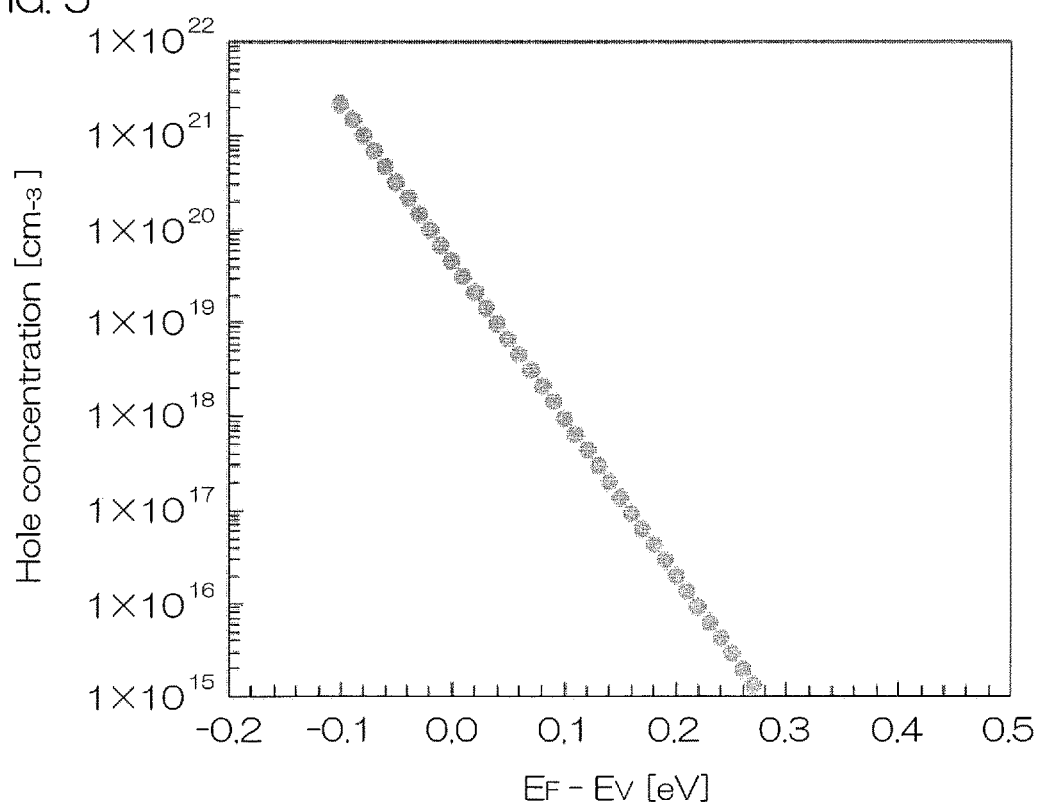
FIG. 5 is a graph of a relationship of depth of a Fermi level from a valence band of a semiconductor $(E_T-E_V)$ and hole concentration.
Figure 6:
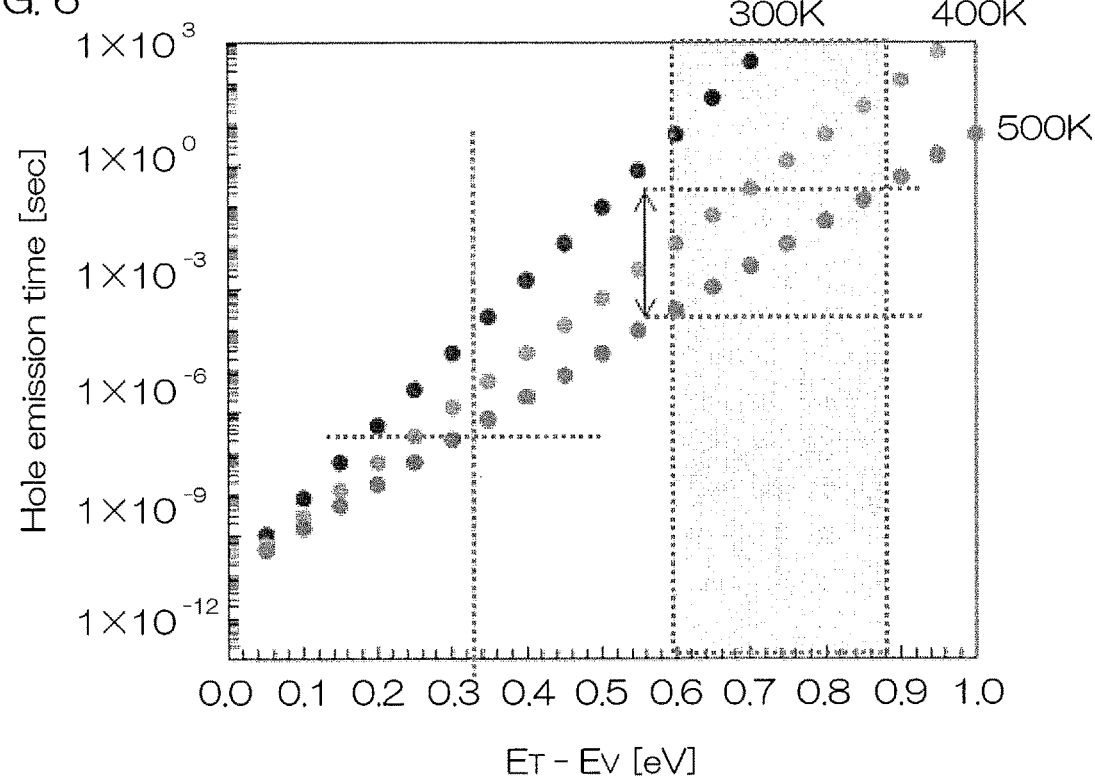
FIG. 6 is a graph of a relationship of depth of an acceptor level from the valence band $(E_T-E_V)$ and hole emission time.
Figure 7:
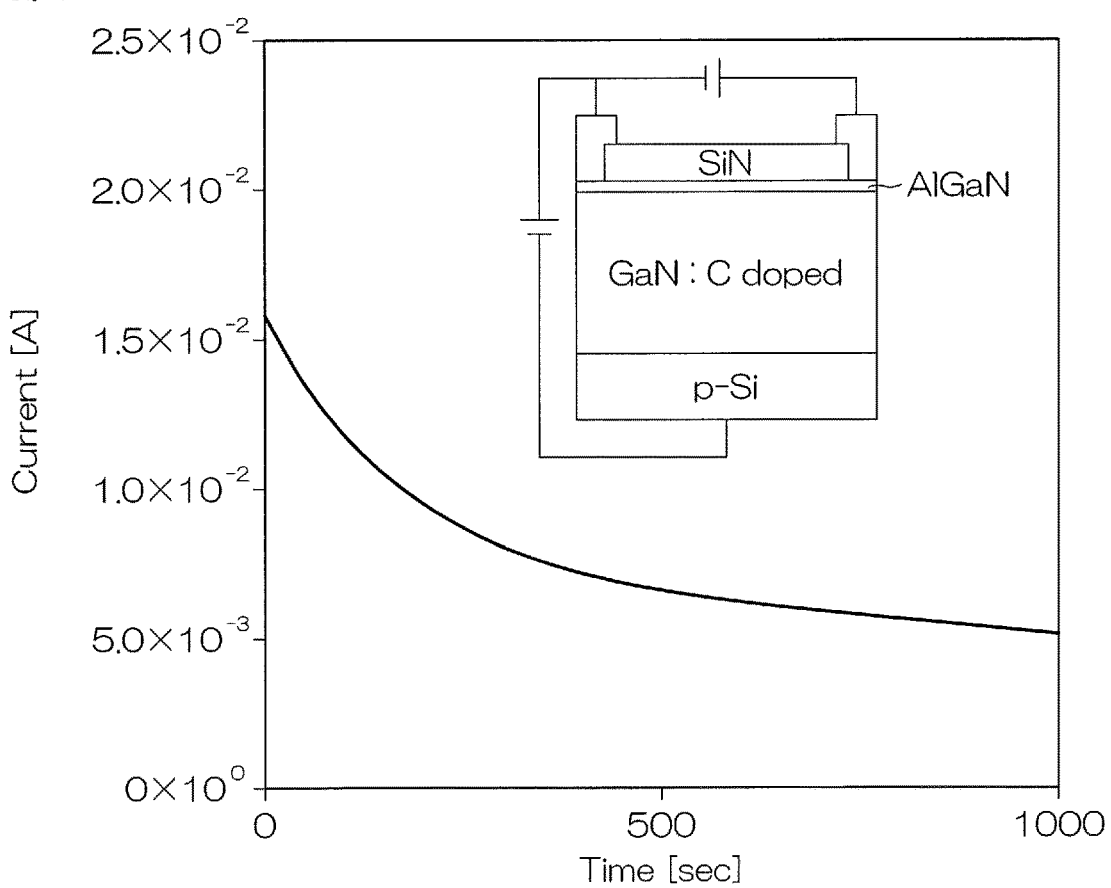
FIG. 7 is a diagram illustrating a time constant from voltage application to emission of holes from an acceptor level formed by C.
Figure 8:
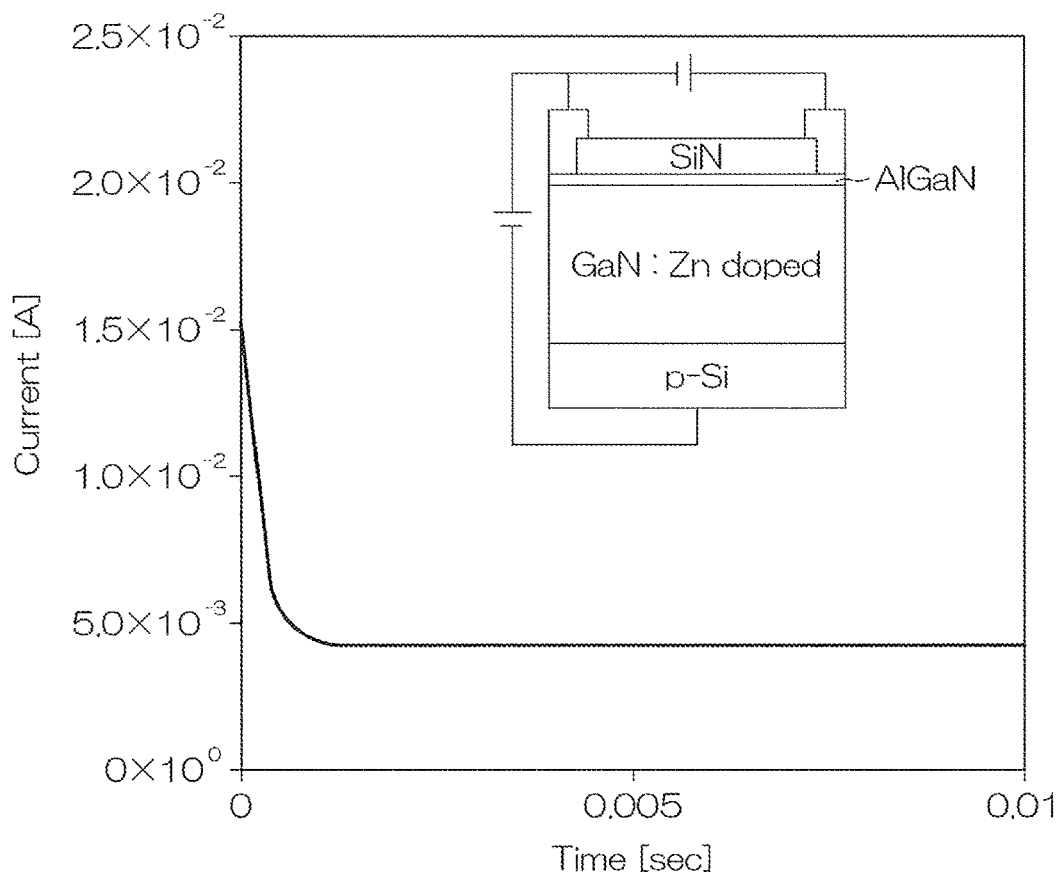
FIG. 8 is a diagram illustrating a time constant from voltage application to emission of holes from an acceptor level formed by Zn.

FIG. 5 is a graph of a relationship of depth of a Fermi level from a valence band of a semiconductor ($E_F$-$E_V$) and hole concentration. FIG. 6 is a graph of a relationship of the depth of the acceptor level from the valence band ($E_T$-$E_V$) and hole emission time. FIG. 7 is a diagram illustrating a time constant from voltage application to emission of holes from an acceptor level formed by C. FIG. 8 is a diagram illustrating a time constant from voltage application to emission of holes from an acceptor level formed by Zn.

When a negative bias is applied to the substrate while a current flows across source and drain, holes are emitted from the acceptor level and the acceptor level becomes negatively charged. By the acceptor level becoming negatively charged, a two-dimensional electron gas density decreases and the current across source and drain decreases.

Whereas in FIG. 7, it takes approximately 1000 seconds for the current to decrease, in FIG. 8, the current decreases in approximately 1 millisecond. That is, when voltage is applied, whereas it takes 1000 seconds for an acceptor level formed by C ($E_T$-$E_V$=0.9 eV) to become negatively charged, an acceptor level formed by Zn ($E_T$-$E_V$=0.3 eV) becomes negatively charged in 1 millisecond.

As mentioned above, the first impurity layer 7 of the nitride semiconductor device 1 contains the first impurity (for example, Zn) such that the depth of the acceptor level from the valence band ($E_T$-$E_V$) is made not less than 0.3 eV but less than 0.6 eV. When the acceptor impurity is doped, the Fermi level of the impurity layer is fixed at the acceptor level such that $E_T$-$E_V$=$E_F$-$E_V$.

First, as shown in FIG. 5, when an $E_F$-$E_V$ dependence of the hole concentration is calculated by a Fermi-Dirac distribution function, the results are such that when $E_F$-$E_V$ is less than 0.3 eV, the hole concentration exceeds $1\times10^{15}$ cm$^{-3}$ and insulation becomes insufficient. For example, when Mg ($E_F$-$E_V$=0.2 eV) is doped as the impurity in the first impurity layer 7, the hole concentration of the first impurity layer 7 becomes approximately $1\times10^{16}$ cm$^{-3}$.

On the other hand, if $E_T$-$E_V$ is not less than 0.3 eV (for example, Zn=0.3 eV), the hole concentration can be suppressed to not more than $1\times10^{15}$ cm$^{-3}$ and the insulation can be improved (high resistance can be achieved) and therefore a leak current flowing from the electron transit layer 8 to the substrate 4 can be suppressed. That is, the first impurity layer 7 can be made high in resistance and therefore the leak current can be suppressed without making a thickness of the semiconductor laminated structure 5 thick.

On the other hand, when $E_T$-$E_V$ is not less than 0.6 eV, the hole emission time exceeds 1 s ($1\times10^0$ s) depending on a usage temperature condition (300 K, 400 K, or 500 K) in some cases. The hole emission times can be calculated based on times until stabilization of current value when the nitride semiconductor structures shown in FIG. 7 and FIG. 8 are put in conducting states. For example, as shown in FIG. 7, if C ($E_T$-$E_V$=0.6 eV to 0.9 eV) is doped as the impurity in the first impurity layer 7, a deep level is formed in the first impurity layer 7 and response to voltage is not less than 1000 s and not high, and because it takes not less than 1000 seconds for a charge state of a device interior to change when a voltage is applied, this becomes a cause of change of device characteristics with time, such as threshold shift (Vth shift), current collapse, etc. On the other hand, if $E_T$-$E_V$ is less than 0.6 eV (for example, Zn=0.3 eV), the response to voltage is not more than 1 ms and it can thus be understood that stability of device characteristics is far superior in comparison to the case of using C.

Here, the threshold shift (Vth shift) refers, for example, to a fluctuation of a threshold Vth that occurs when a gate voltage or a drain voltage is applied, and it can be said that if the threshold shift is small, operation as a semiconductor device is stable.

Next, doping characteristics of Zn as an example of the first impurity contained in the first impurity layer 7 shall be described with reference to FIG. 9 and FIG. 10.

Figure 9:
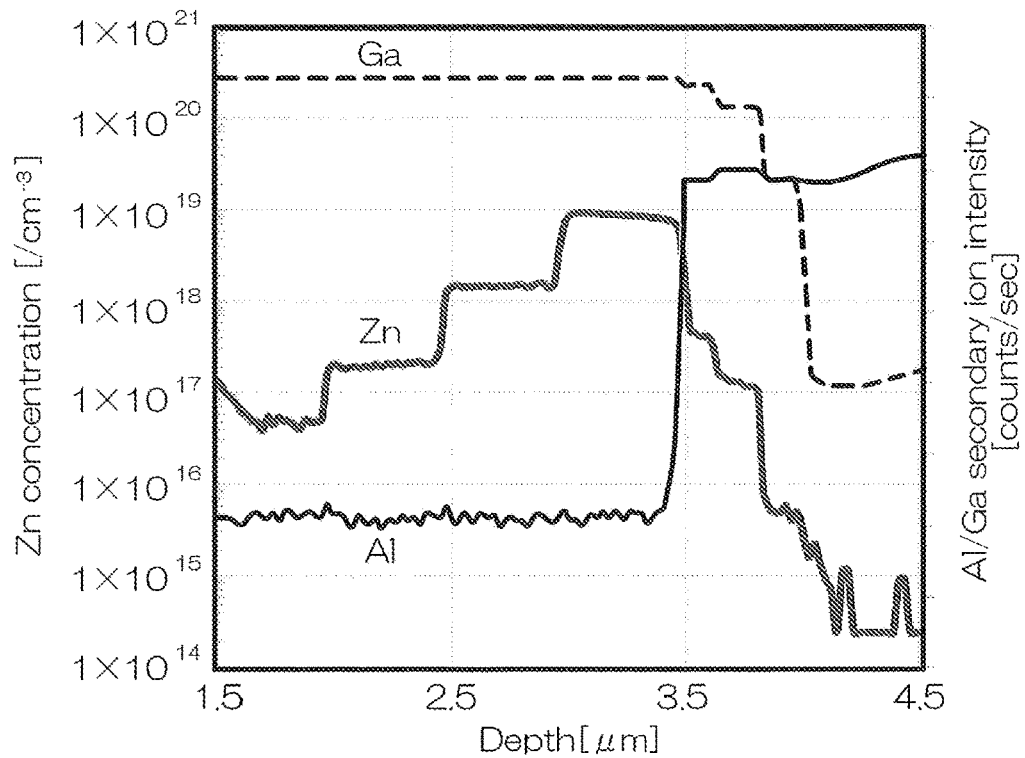
FIG. 9 is a diagram for describing controllability of doping amount of Zn.

First, as shown in FIG. 9, when an AlGaN layer (3.5 μm thickness) was crystal-grown while doping Zn, it was found that the Zn concentration can be adjusted satisfactorily in a range of $1\times10^{17}$ cm$^{-3}$ to $1\times10^{19}$ cm$^{-3}$ in the AlGaN layer. That is, a doping amount of Zn with respect to the first impurity layer 7 made of the $Al_{1-X}Ga_XN$ (0<X≤1) based material can be controlled satisfactorily and therefore, the doping amount of Zn can be adjusted easily in accordance with design withstand voltage and other characteristics of the nitride semiconductor device 1.

Figure 10:
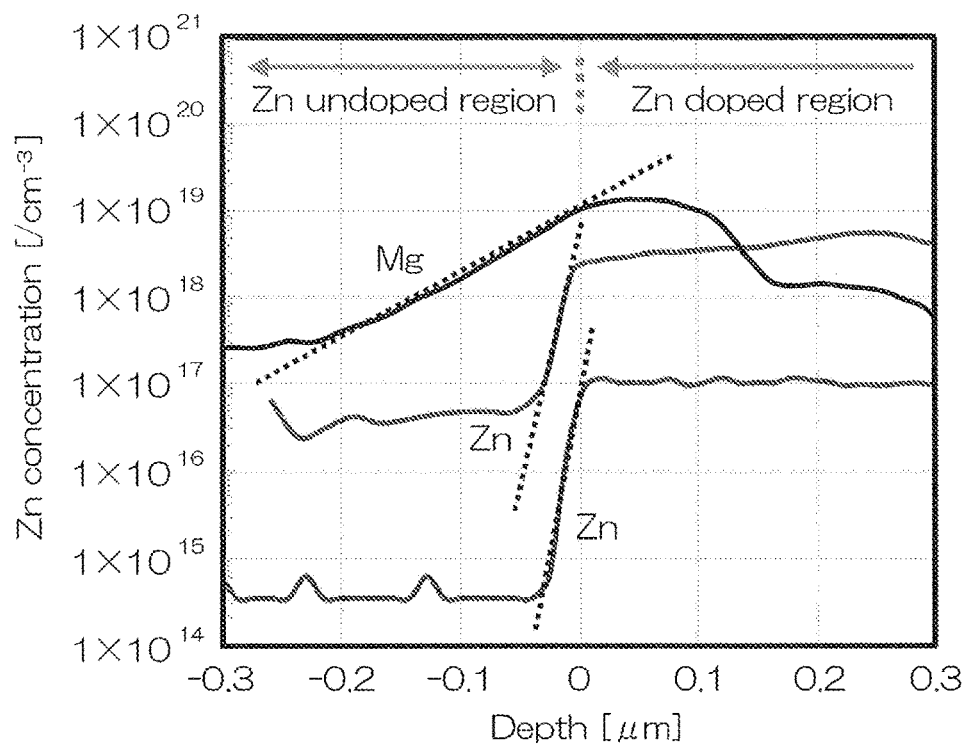
FIG. 10 is a diagram of a concentration profile at an interface portion between an impurity-doped region and an undoped region.

Next, as shown in FIG. 10, with Zn as the impurity, a concentration profile at an interface portion (when supply of impurity is turned off) between a doped region and an undoped region becomes steep in comparison, for example, to Mg. For example, with Mg, a thickness (depth) of approximately 0.15 μm is required for the concentration to decrease by one order of magnitude (to decrease from $1\times10^{19}$ cm$^{-3}$ to $1\times10^{18}$ cm$^{-3}$ in FIG. 10) after the supply is turned off.

On the other hand, with Zn, a thickness (depth) of approximately 0.02 μm is sufficient for the concentration to decrease by one order of magnitude (to decrease from $3\times10^{19}$ cm$^{-3}$ to $3\times10^{18}$ cm$^{-3}$ or to decrease from $1\times10^{17}$ cm$^{-3}$ to $1\times10^{16}$ cm$^{-3}$ in FIG. 10) after the supply is turned off. Impurity characteristics of a semiconductor layer formed on the first impurity layer 7 is thus hardly influenced.

A nitride semiconductor layer that is undoped and is intentionally made not to contain an impurity can thus be formed satisfactorily on a nitride semiconductor layer having a composition similar to the first impurity layer 7.

Figure 11:
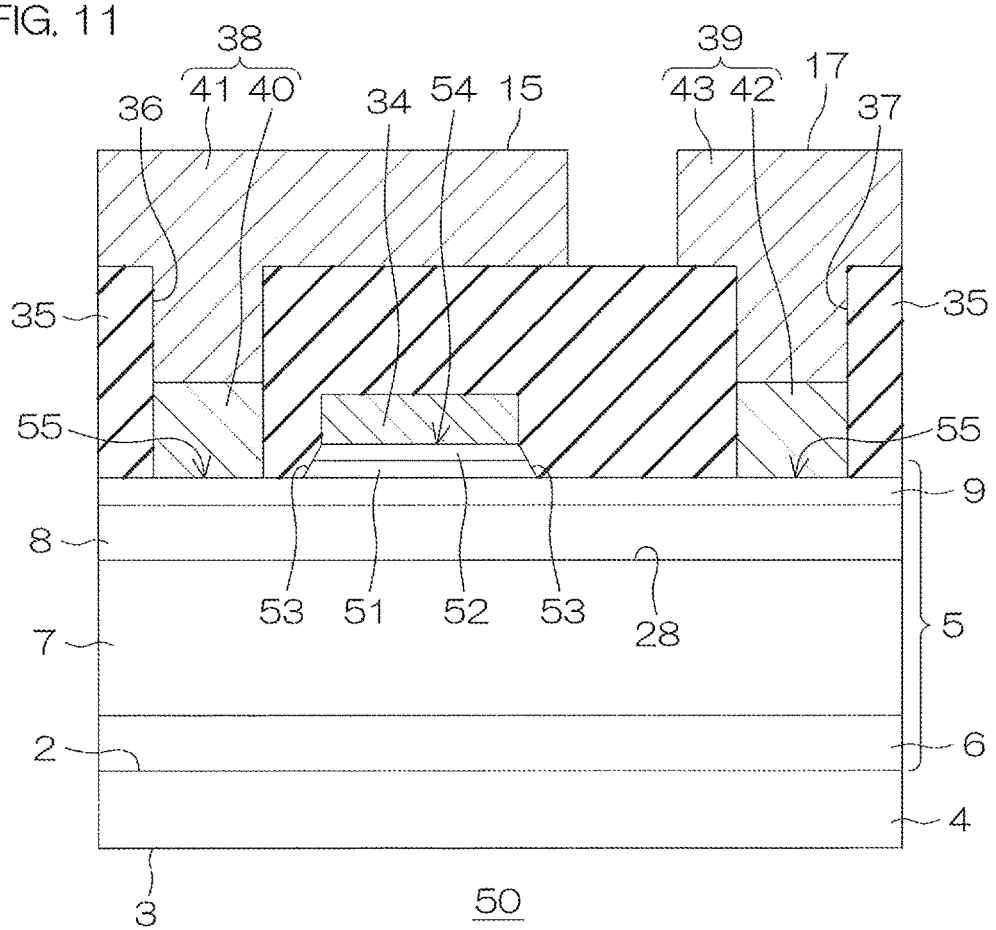
FIG. 11 is a schematic sectional view of a nitride semiconductor device according to another preferred embodiment of the present invention.
Figure 12:
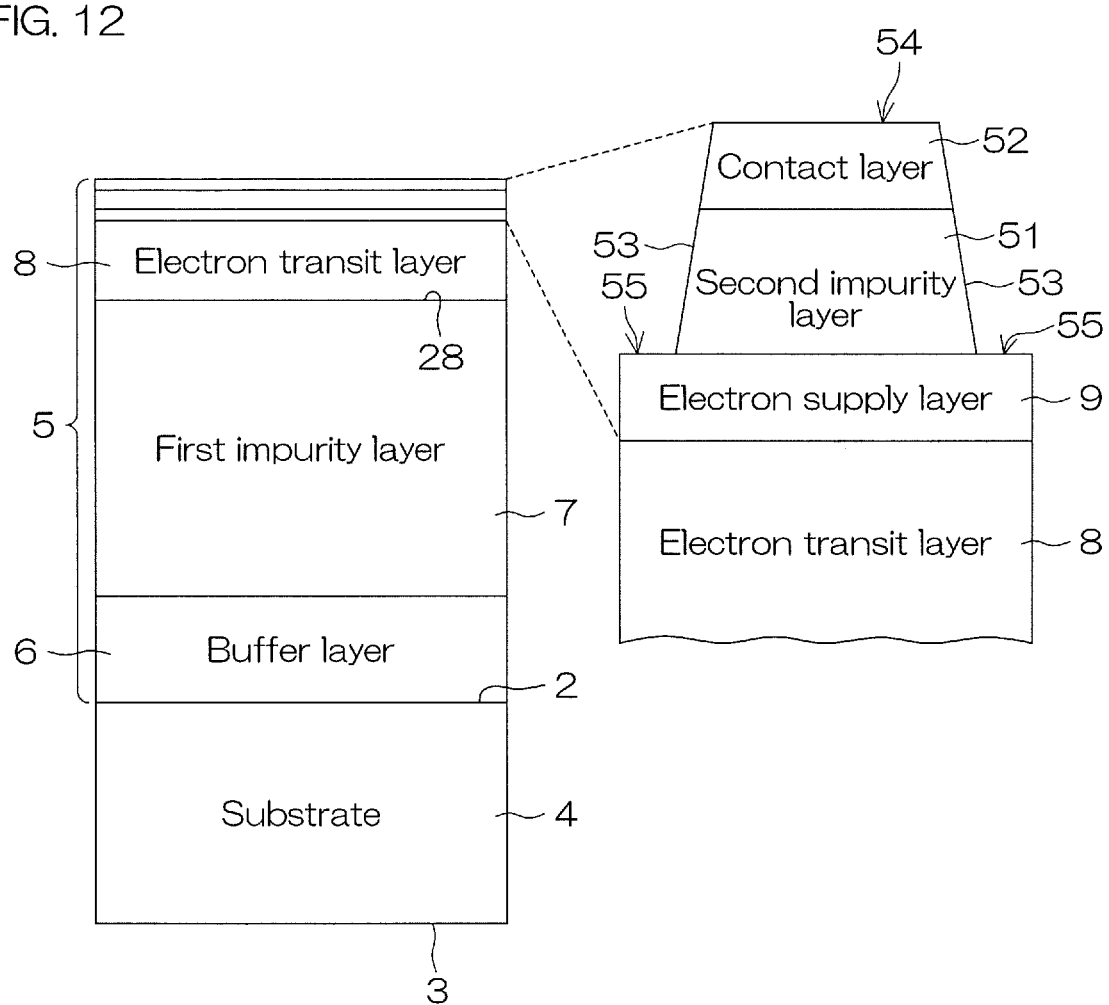
FIG. 12 is a schematic diagram of a layer arrangement of a semiconductor laminated structure of FIG. 11.

Thus, a nitride semiconductor device 50 shown in FIG. 11 and FIG. 12 includes a second impurity layer 51 formed on the electron transit layer 8, made of an $Al_{1-X}Ga_XN$ (0<X≤1) based material, and containing a second impurity with which the depth of the acceptor level from the valence band ($E_T$-$E_V$) is made not less than 0.3 eV but less than 0.6 eV and a contact layer 52 that is undoped and is formed on the second impurity layer 51.

As with the first impurity layer 7, for example, Zn, etc., can be applied as the impurity contained in the second impurity layer 51. When the second impurity layer 51 contains Zn, the concentration thereof may, for example, be $5\times10^{17}$ cm$^{-3}$ to $5\times10^{19}$ cm$^{-3}$. A thickness of the second impurity layer 51 may, for example, be 60 nm to 100 nm.

As the contact layer 52, for example, a layer made of an $Al_{1-X}Ga_XN$ (0<X≤1) based material that is undoped can be applied and, for example, it may be an undoped GaN layer or an undoped AlGaN layer. Also, a Zn concentration of the contact layer 52 may be not more than $5\times10^{16}$ cm$^{-3}$. Also, a thickness of the contact layer 52 may, for example, be not more than 10 nm.

Also, the nitride semiconductor device 50 includes, as a portion of the semiconductor laminated structure 5, mesa laminated portions 54 each having wall surfaces 53 extending over the contact layer 52 and the second impurity layer 51, the electron supply layer 9 includes extension portions 55 extending in a direction intersecting a lamination direction of the mesa laminated portions 54 with respect to the mesa laminated portions 54, and the source electrodes 38 and the drain electrodes 39 are connected to the extension portions 55.

Also, the gate electrode 34 is directly joined to the contact layer 52 without intervention of an insulating film. Although the contact layer 52 is formed such that the contact layer 52 is in contact with the second impurity layer 51, influence due to Zn is made low by the steepness of the concentration profile of Zn shown in FIG. 10. Therefore, the contact layer 52 can be formed satisfactorily as an undoped layer and the gate electrode 34 can thus be put in Schottky junction with the contact layer 52 satisfactorily.

Consequently, a Schottky barrier can be formed between the gate electrode 34 and the contact layer 52 and a leak current to the gate electrode 34 can be reduced.

Next, operation characteristics of the nitride semiconductor device 1 shall be described with reference to FIG. 13 and FIG. 14.

Figure 13:
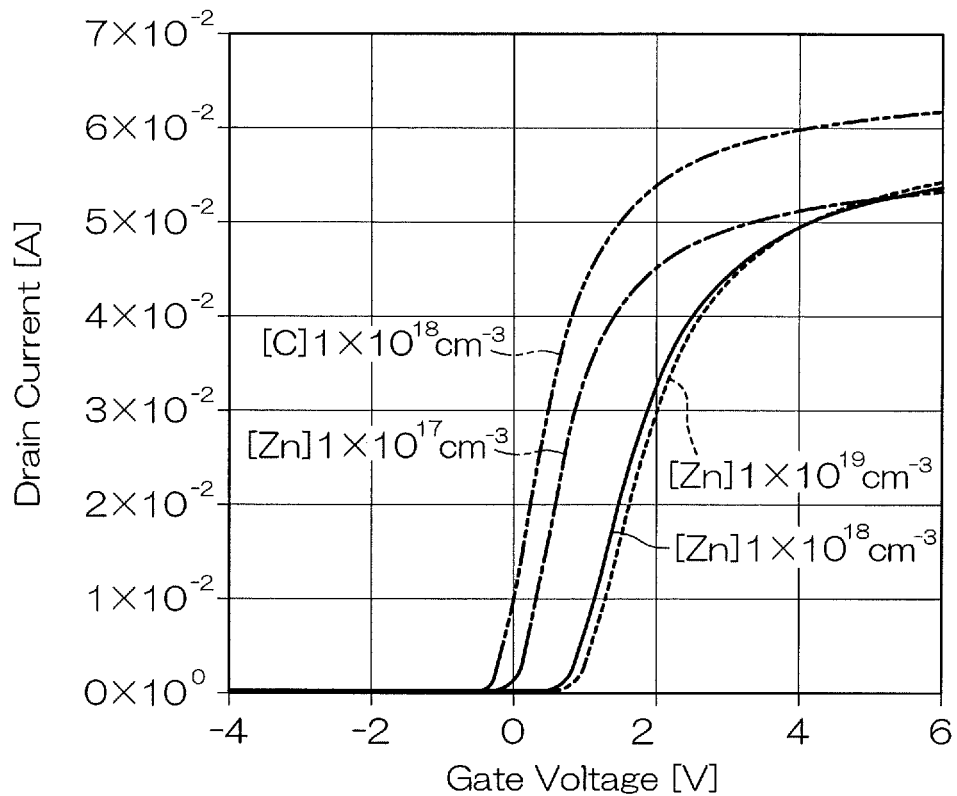
FIG. 13 is a diagram of drain current vs. gate voltage characteristics of an HEMT.
Figure 14:
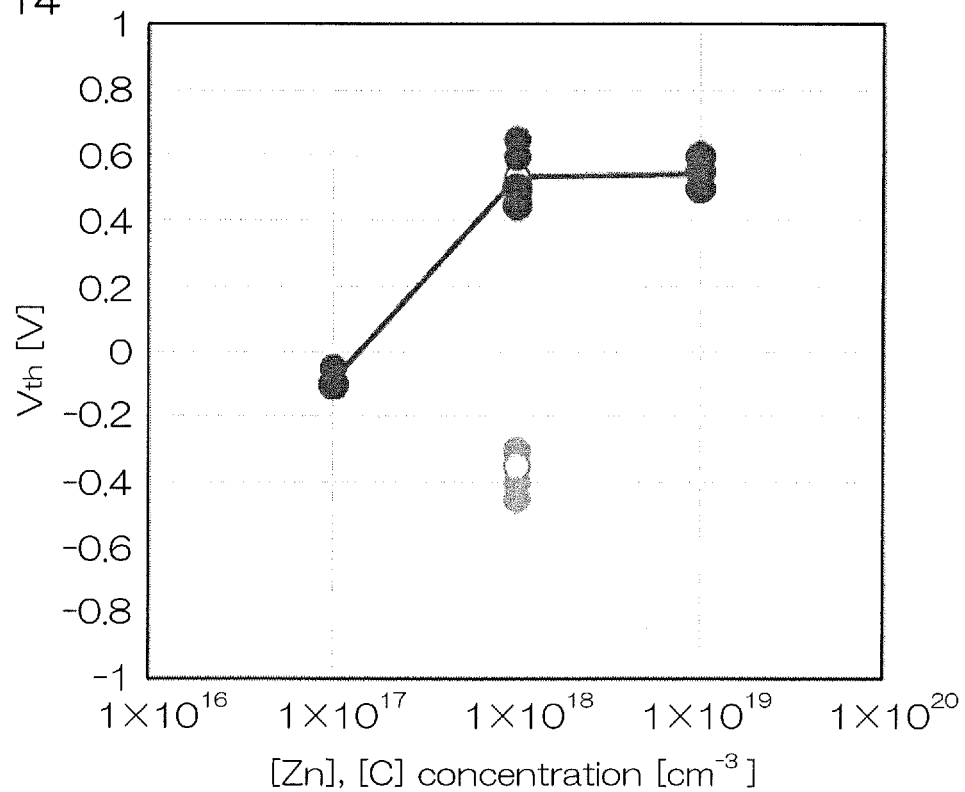
FIG. 14 is a diagram of a relationship of Zn concentration/C concentration and gate threshold voltage (Vth).

As shown in FIG. 13 and FIG. 14, how much a gate threshold voltage changes was compared for a case where the first impurity layer 7 contains C at a concentration of $1\times10^{18}$ cm$^{-3}$ and cases where the first impurity layer 7 contains Zn at concentrations of $1\times10^{17}$ cm$^{-3}$, $1\times10^{18}$ cm$^{-3}$, and $1\times10^{19}$ cm$^{-3}$.

As is clear from the figures, in cases where Zn is contained, regardless of the Zn concentration, the gate threshold voltage could be made high in comparison to the case where C is contained. Also, as shown in FIG. 14, although the gate threshold voltage increases as the Zn concentration increases, it is considered to converge at a level of $1\times10^{19}$ cm$^{-3}$.

The gate threshold voltage can thus be made comparatively high and therefore, satisfactory normally-off operation can be achieved in the nitride semiconductor device 1.

Figure 15:
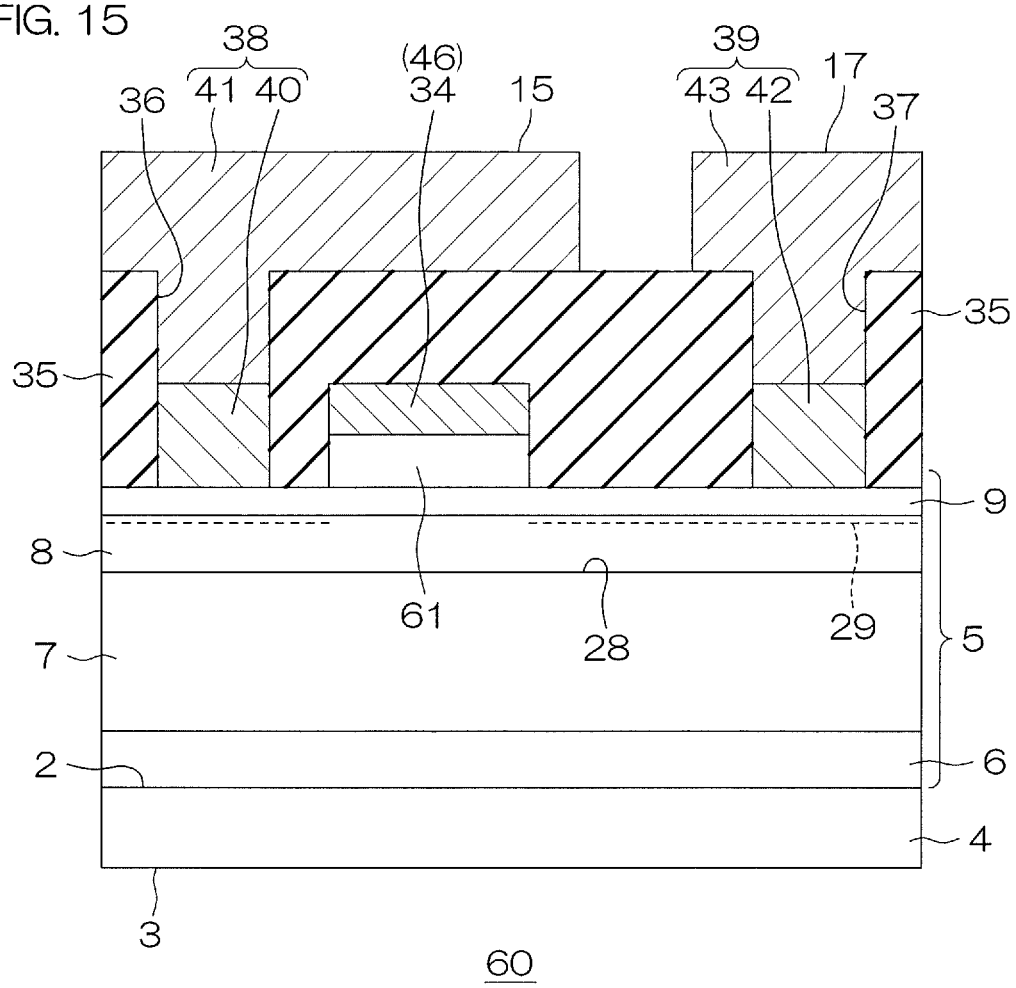
FIG. 15 is a schematic sectional view of a nitride semiconductor device of another preferred embodiment of the present invention.

FIG. 15 is a schematic sectional view of a nitride semiconductor device 60 of another preferred embodiment of the present invention. In FIG. 15, components in common to components of the nitride semiconductor device 1 of FIG. 3 are provided with the same reference symbols and description thereof shall be omitted.

The nitride semiconductor device 60 according to the present preferred embodiment differs from the nitride semiconductor device 1 in regard to positional configuration of the gate electrode 34.

More specifically, with the nitride semiconductor device 1, the gate electrode 34 is formed on the insulating layer 33 covering inner surfaces of the recesses 30 of the semiconductor laminated structure 5. On the other hand, with the nitride semiconductor device 60, the recesses 30 are not formed in the semiconductor laminated structure 5. Also, with the nitride semiconductor device 60, the cap layer 10 is not formed on the electron supply layer 9. Instead, a gate layer 61 is formed on the electron supply layer 9 and the gate electrode 34 is formed on the gate layer 61.

The gate layer 61 is made, for example, of an $Al_{1-X}Ga_XN$ ($0<X\leq 1$) based material and, for example, may be a GaN layer. In the present preferred embodiment, the gate layer 61 contains Zn as an impurity.

Also, a thickness of the gate layer 61 is, for example, not more than 60 nm, is preferably 60 nm to 165 nm, and is even more preferably 80 nm to 165 nm. Also, a Zn concentration of the gate layer 61 is, for example, not less than $1\times 10^{19}$ $cm^{-3}$ and is preferably $1\times 10^{19}$ $cm^{-3}$ to $9\times 10^{19}$ $cm^{-3}$.

With the nitride semiconductor device 60, positive polarization charges generated in a vicinity of a heterointerface of the electron supply layer 9 with the electron transit layer 8 are cancelled out by a spontaneous polarization generated inside the gate layer 61 and consequently, the two-dimensional electron gas 29 disappears selectively in regions directly below the gate electrode 34. The distribution region of the two-dimensional electron gas 29 is thereby divided with the regions directly below the gate electrode 34 as boundaries and normally-off operation of the nitride semiconductor device 60 is thereby achieved.

Next, effects of introducing the gate layer 61 that contains Zn shall be described with reference to FIG. 16 to FIG. 38. In evaluations indicated below, a nitride semiconductor device of an arrangement that differs from the nitride semiconductor device 60 in the point of not including the buffer layer 6 and the first impurity layer 7 was used as an evaluation device and respective characteristics were measured.

Figure 16:
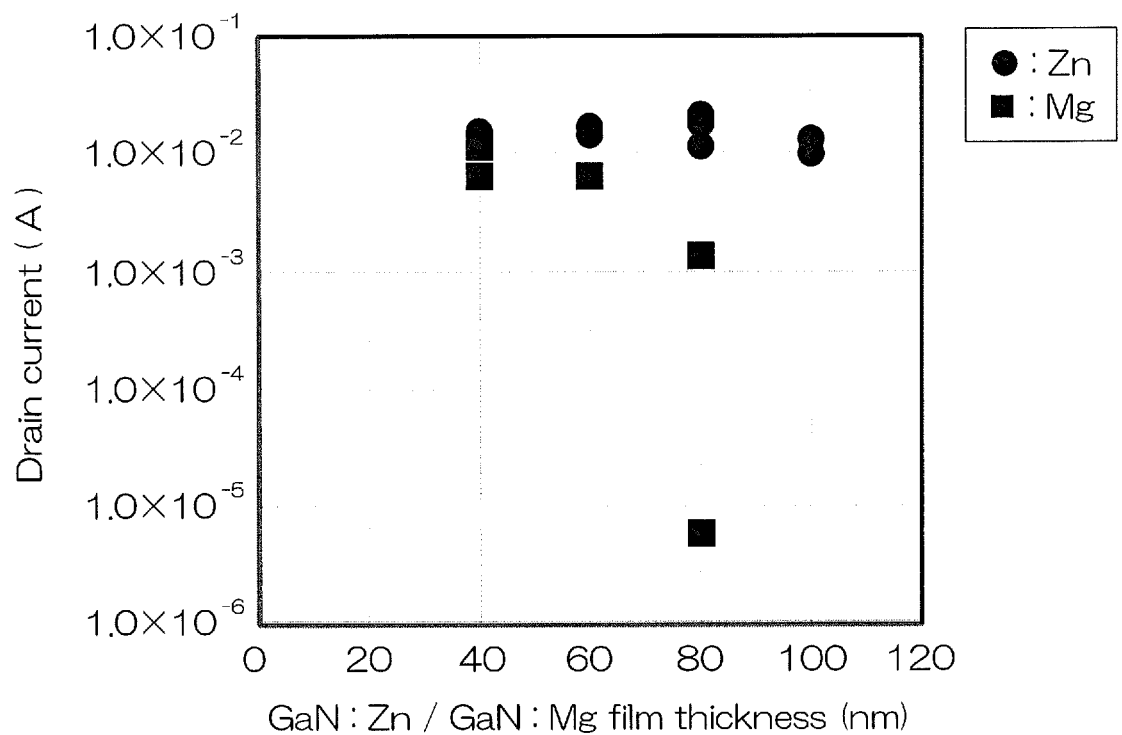
FIG. 16 is a graph of a relationship of respective film thicknesses of GaN (Zn) and GaN (Mg) and drain current.
Figure 17:
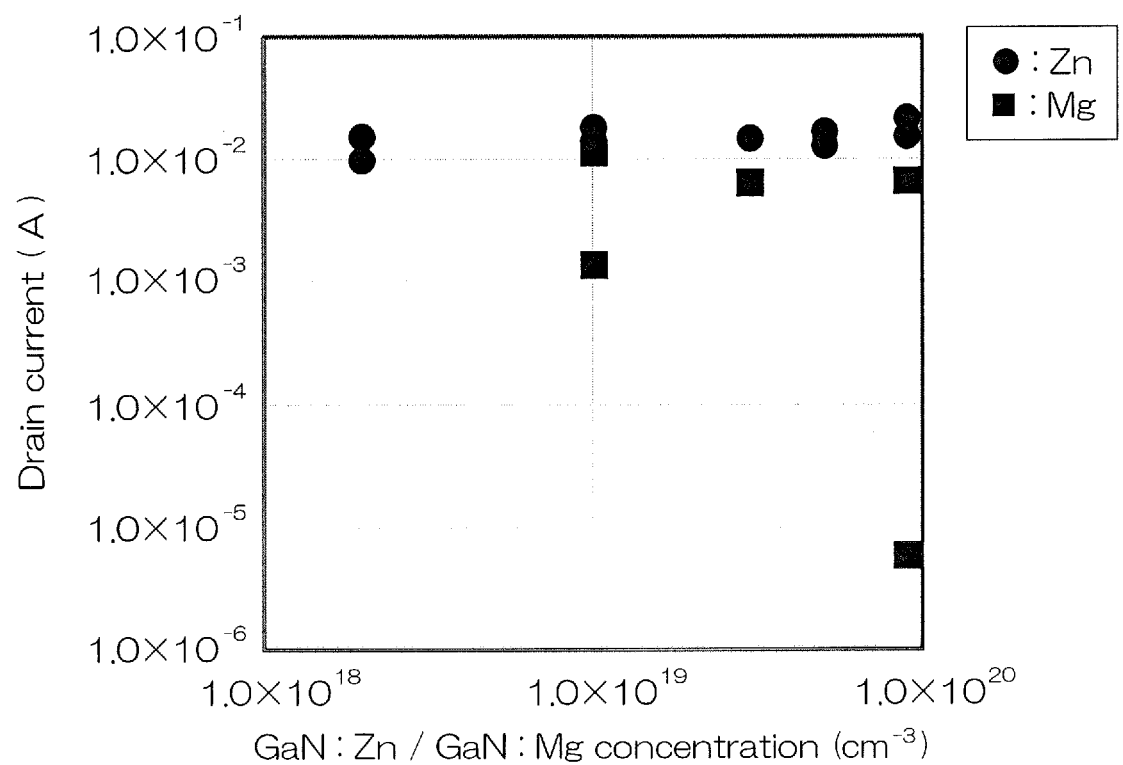
FIG. 17 is a graph of a relationship of respective impurity concentrations of GaN (Zn) and GaN (Mg) and the drain current.

FIG. 16 is a graph of a relationship of respective film thicknesses of GaN (Zn) and GaN (Mg) and drain current. FIG. 17 is a graph of a relationship of respective impurity concentrations of GaN (Zn) and GaN (Mg) and the drain current. Here, GaN (Zn) signifies a gate layer made of GaN containing just Zn as the impurity and GaN (Mg) signifies a gate layer made of GaN containing just Mg as the impurity (the same applies hereinafter). Both gate layers may contain a minute amount of impurity that is mixed in unintentionally.

As shown in FIG. 16 and FIG. 17, when the gate layer 61 contains Zn, the drain current is stable regardless of film thickness and Zn concentration. For example, even when the thickness of the gate layer 61 increases from 60 nm to 100 nm (see FIG. 16) or even when the Zn concentration of the gate layer 61 increases from $1\times 10^{19}$ $cm^{-3}$ to $1\times 10^{20}$ $cm^{-3}$ (see FIG. 17), hardly any influence on magnitude of the drain current is seen.

On the other hand, when the gate layer 61 contains Mg, the drain current decreases with increase in film thickness and Mg concentration. For example, when the thickness of the gate layer 61 is 80 nm and when the Mg concentration of the gate layer 61 is $1\times 10^{20}$ $cm^{-3}$, the drain current is extremely small in value. That is, from FIG. 16 and FIG. 17, it is seen that when the gate layer 61 contains Mg, the device characteristics degrade with increase in film thickness and Mg concentration.

Figure 18:
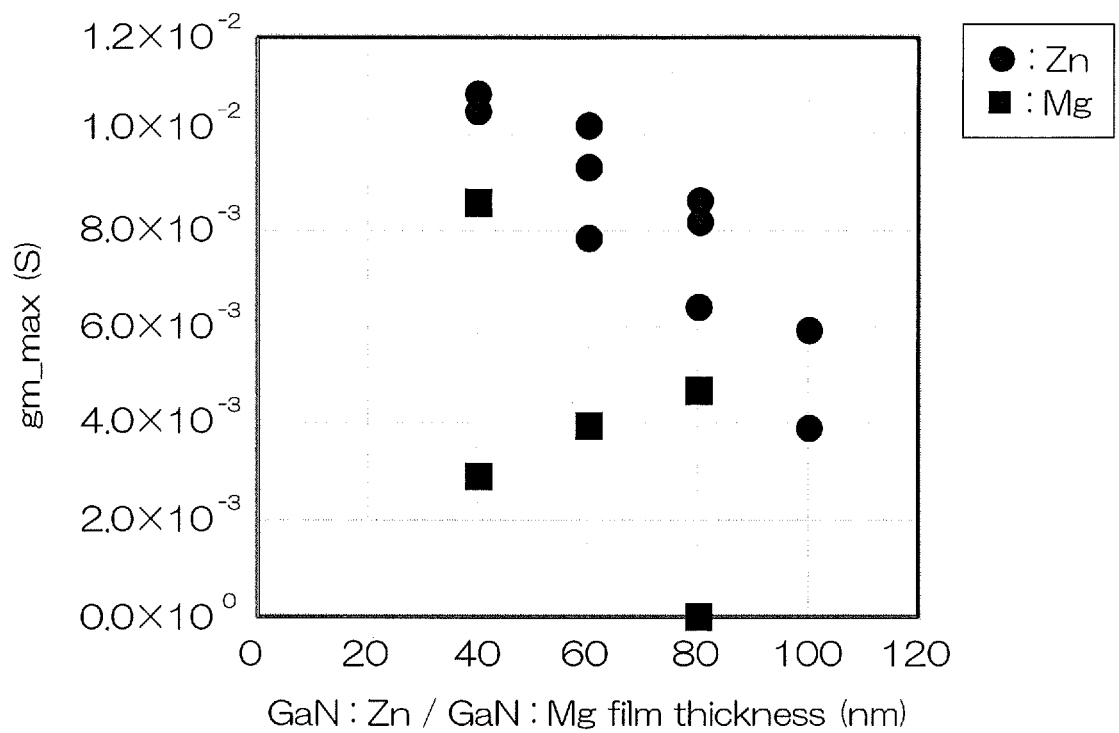
FIG. 18 is a graph of a relationship of the respective film thicknesses of GaN (Zn) and GaN (Mg) and mutual inductance (gm).
Figure 19:
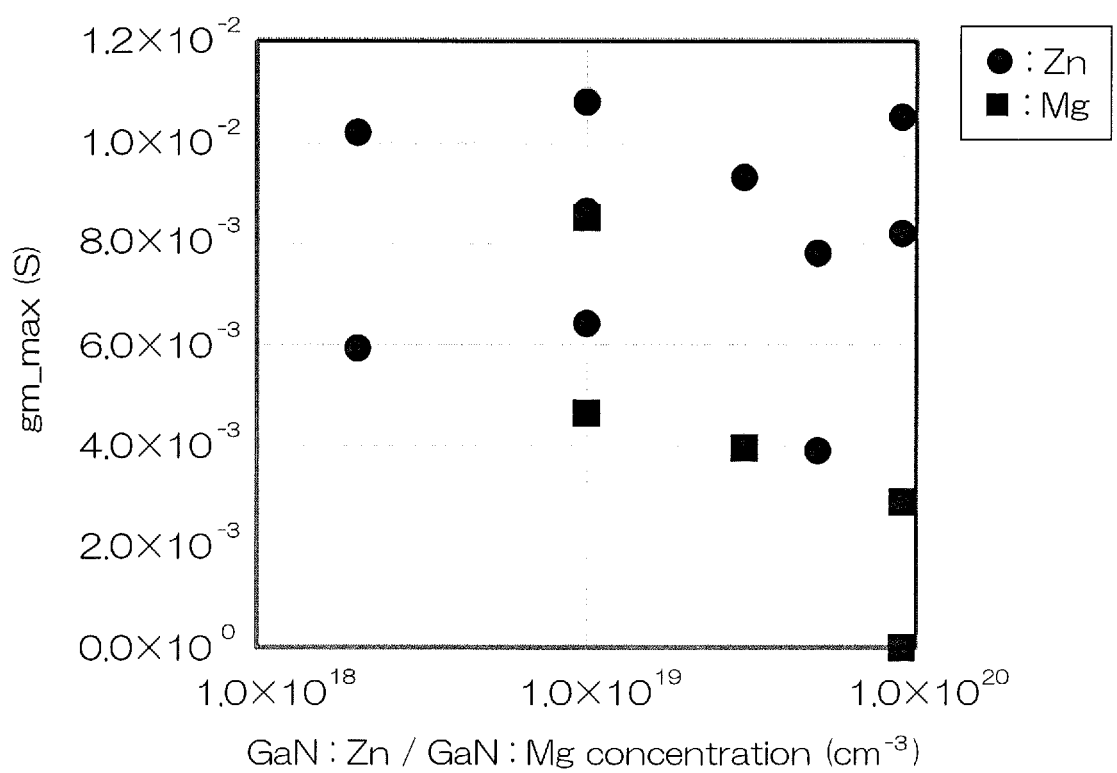
FIG. 19 is a graph of a relationship of the respective impurity concentrations of GaN (Zn) and GaN (Mg) and the drain current.

FIG. 18 is a graph of a relationship of the respective film thicknesses of GaN (Zn) and GaN (Mg) and mutual inductance (gm). FIG. 19 is a graph of a relationship of the respective impurity concentrations of GaN (Zn) and GaN (Mg) and the drain current.

As shown in FIG. 18 and FIG. 19, when the gate layer 61 contains Zn, although with increase in film thickness and Zn concentration, the mutual inductance (gm) is in a decreasing trend, operation as an HEMT device could be confirmed. For example, as shown in FIG. 18, when the film thickness of the gate layer 61 increases from 60 nm to 100 nm, a distance between the gate electrode 34 and the two-dimensional electron gas 29 increases and the mutual inductance (gm) is in a decreasing trend.

On the other hand, when the gate layer 61 contains Mg, with increase in film thickness and Mg concentration, there is seen a point at which the mutual inductance (gm) decreases rapidly. For example, when the thickness of the gate layer 61 is 80 nm and when the Mg concentration of the gate layer 61 is $1\times 10^{20}$ $cm^{-3}$, the mutual inductance (gm) becomes 0 and operation as an HEMT device could not be confirmed. That is, it is also seen from FIG. 18 and FIG. 19 that when the gate layer 61 contains Mg, the device characteristics degrade with increase in film thickness and Mg concentration.

Figure 20:
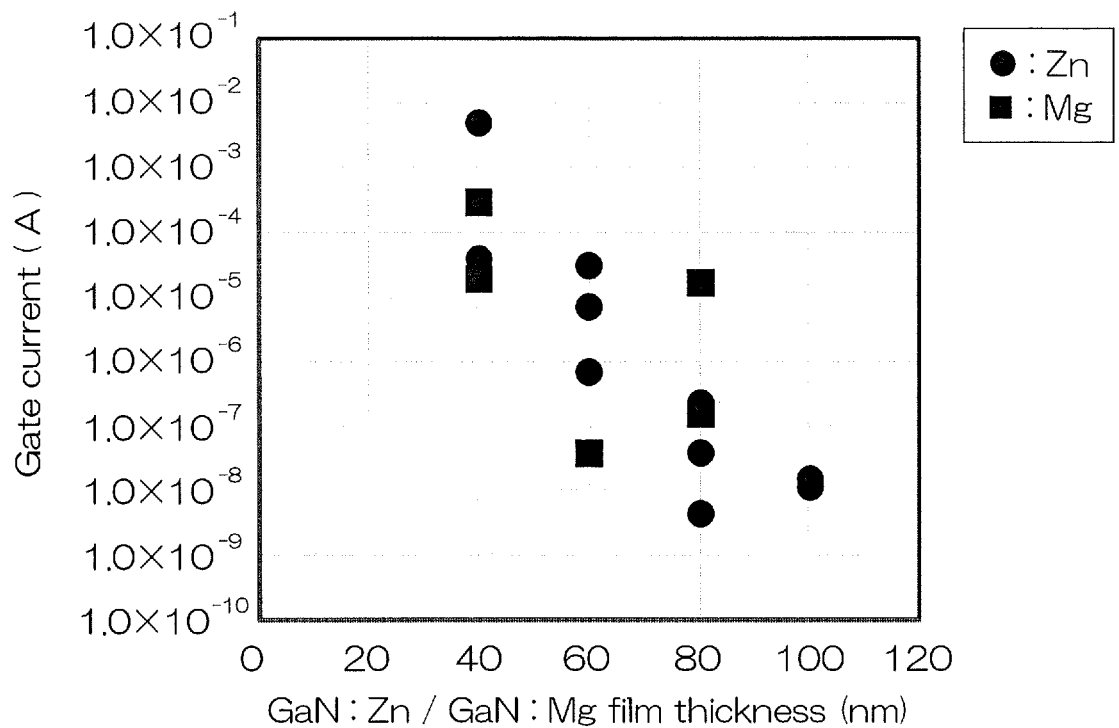
FIG. 20 is a graph of a relationship of the respective film thicknesses of GaN (Zn) and GaN (Mg) and gate leak current.
Figure 21:
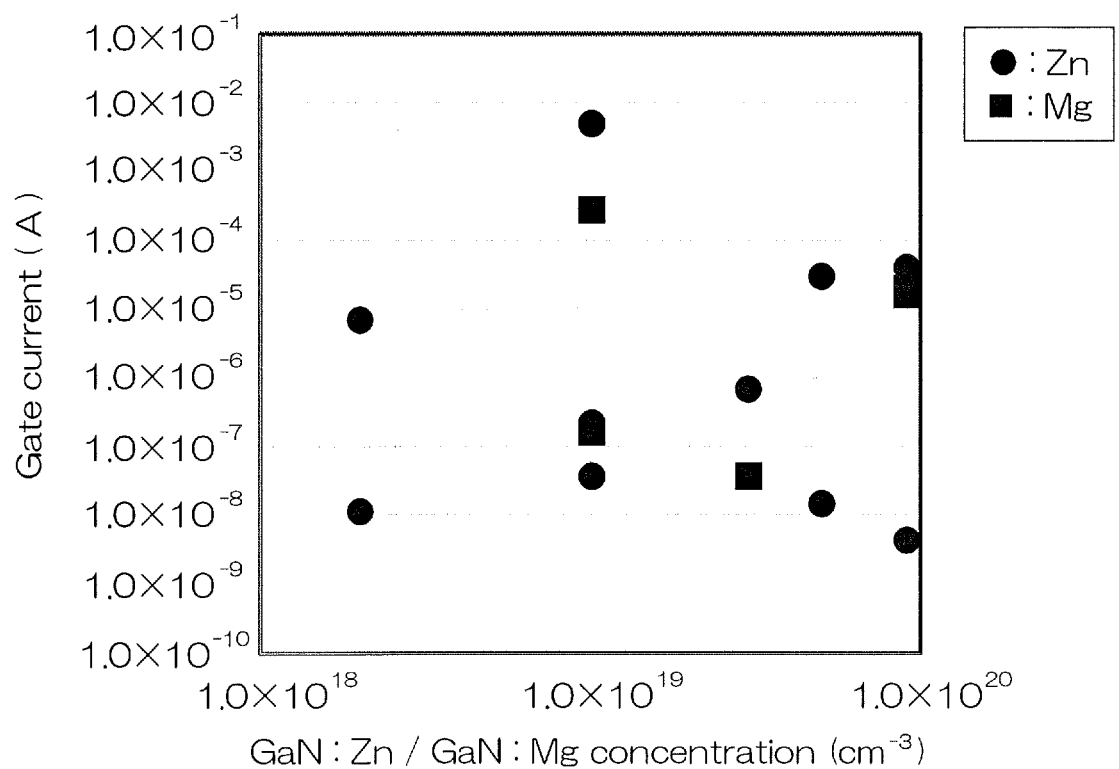
FIG. 21 is a graph of a relationship of the respective impurity concentrations of GaN (Zn) and GaN (Mg) and the gate leak current.

FIG. 20 is a graph of a relationship of the respective film thicknesses of GaN (Zn) and GaN (Mg) and gate leak current. FIG. 21 is a graph of a relationship of the respective impurity concentrations of GaN (Zn) and GaN (Mg) and the gate leak current.

As shown in FIG. 20, it can be confirmed that when the gate layer 61 contains Zn, the gate leak current decreases with increase in film thickness. On the other hand, as shown in FIG. 21, influence of increase/decrease in Zn concentration of the gate layer 61 on magnitude of the gate leak current cannot be confirmed in particular.

On the other hand, when the gate layer 61 contains Mg, with the film thickness of the gate layer 61 being 60 nm as a boundary, the gate leak current is seen to increase whether the film thickness becomes thinner or thicker than 60 nm as shown in FIG. 20. On the other hand, as shown in FIG. 21, influence of increase/decrease in Mg concentration of the gate layer 61 on the magnitude of the gate leak current cannot be confirmed in particular as in the case of Zn. That is, it can be understood from FIG. 20 that in order to decrease the gate leak current, it is preferable to adopt the gate layer 61 that contains Zn and further to increase the film thickness of the gate layer 61.

Figure 22:
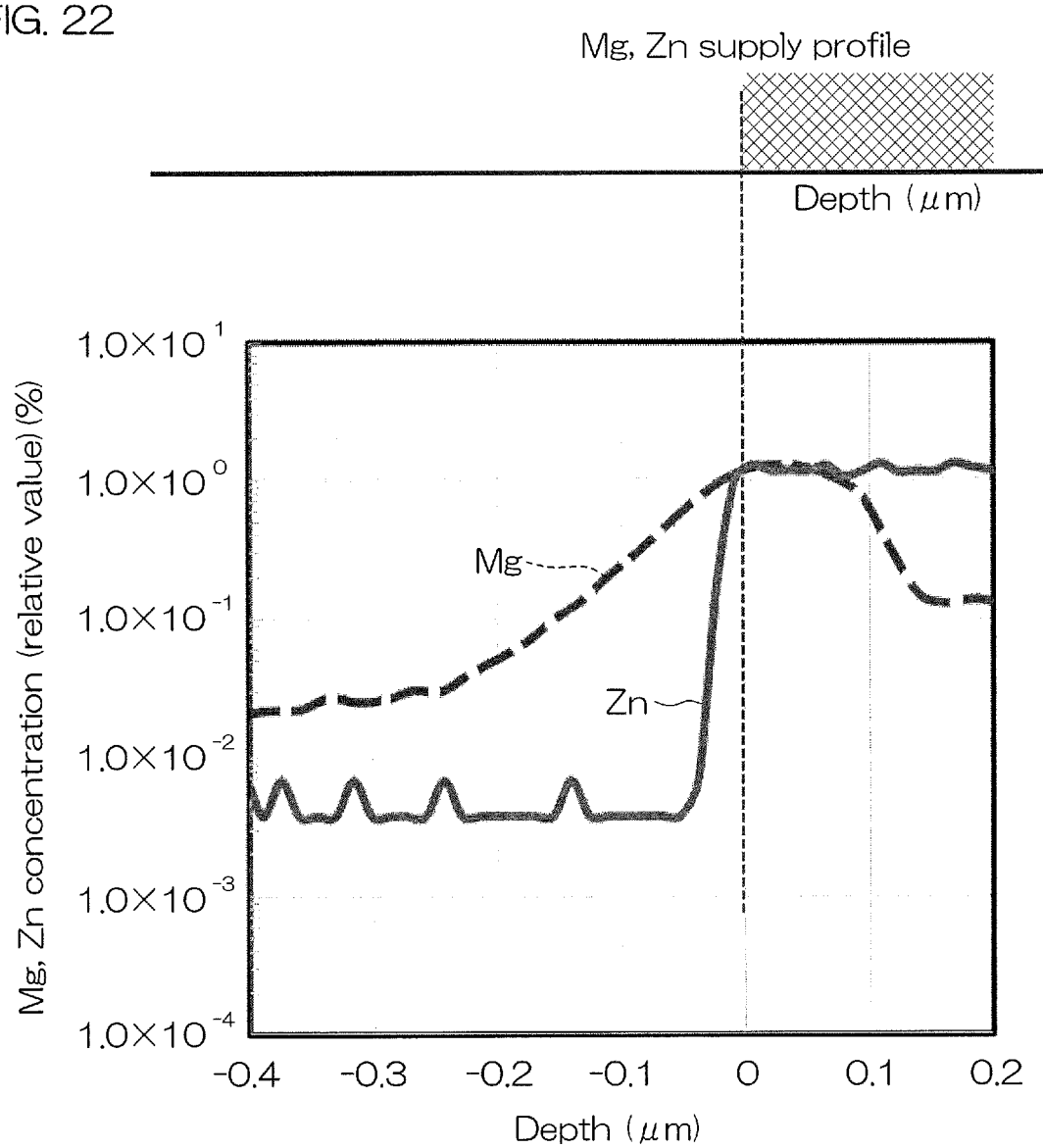
FIG. 22 is a diagram of rising behaviors when GaN is doped with Zn and Mg.
Figure 23:
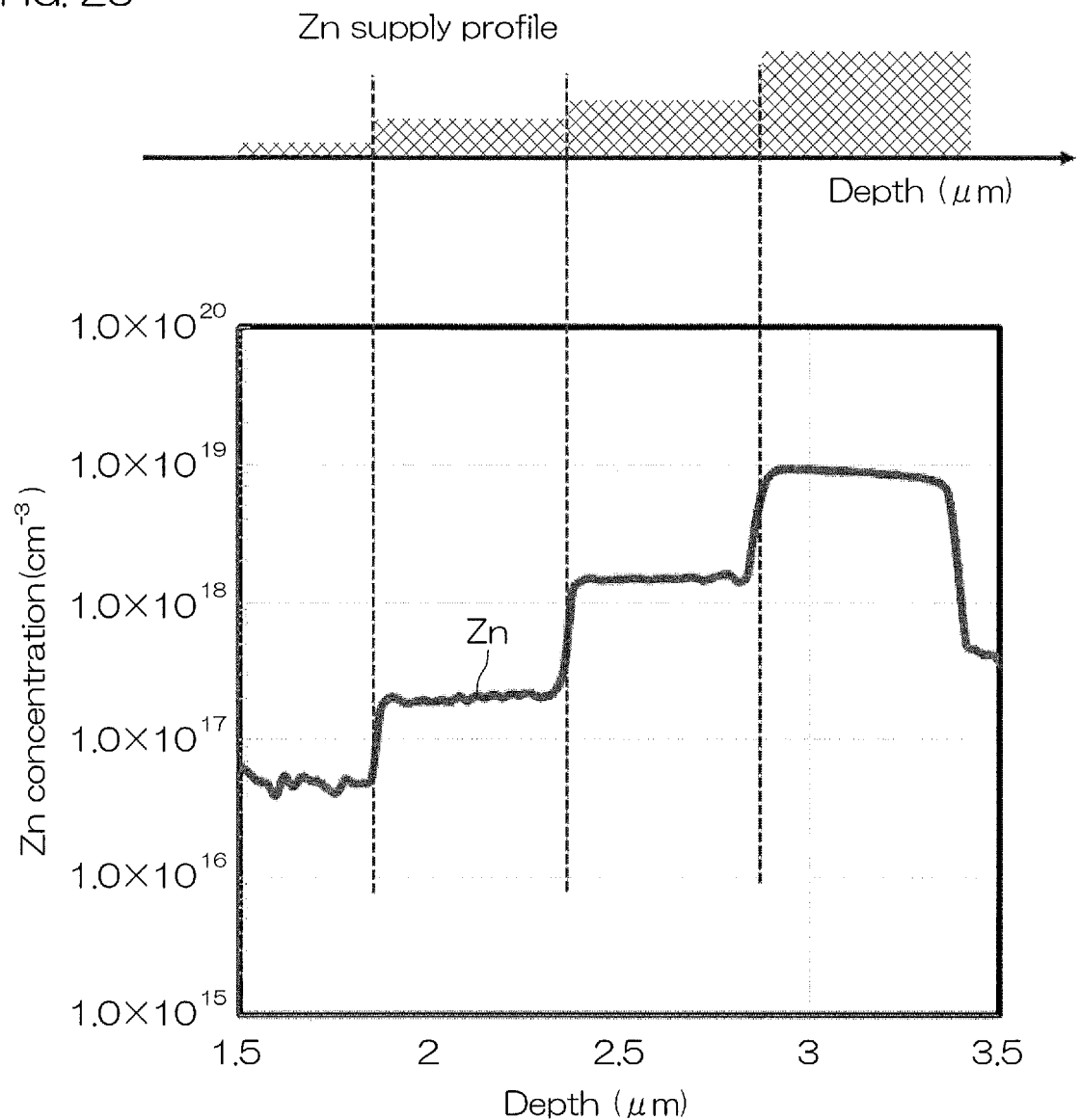
FIG. 23 is a diagram of a doping profile when GaN is doped with Zn.

Also, as shown in FIG. 22 and FIG. 23, Zn is excellent in controllability of doping with respect to GaN in comparison to Mg. For example, as shown in FIG. 22, in regard to rising behavior of doping, Mg is not doped at a concentration in accordance with a supply profile and variation arises in the concentration. On the other hand, with Zn, the doping concentration is stable substantially in accordance with the supply profile.

Further, as shown in FIG. 23, even when a supply concentration is increased stepwise from a GaN surface and Zn is doped deeply from the GaN surface, a doping profile shape substantially matches a supply profile shape. That is, due to influence of a memory effect, Mg is difficult to control in doping profile in comparison to Zn.

Figure 24:
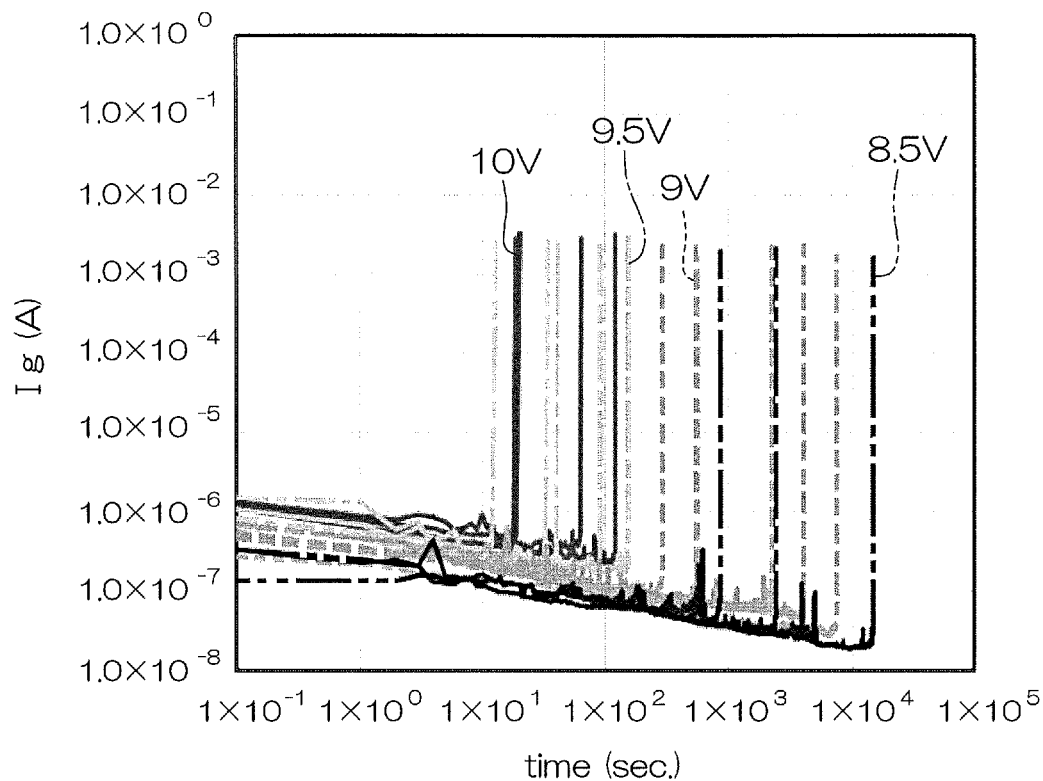
FIG. 24 is a diagram of results of TDDB measurement of a Zn-doped HEMT.
Figure 25:
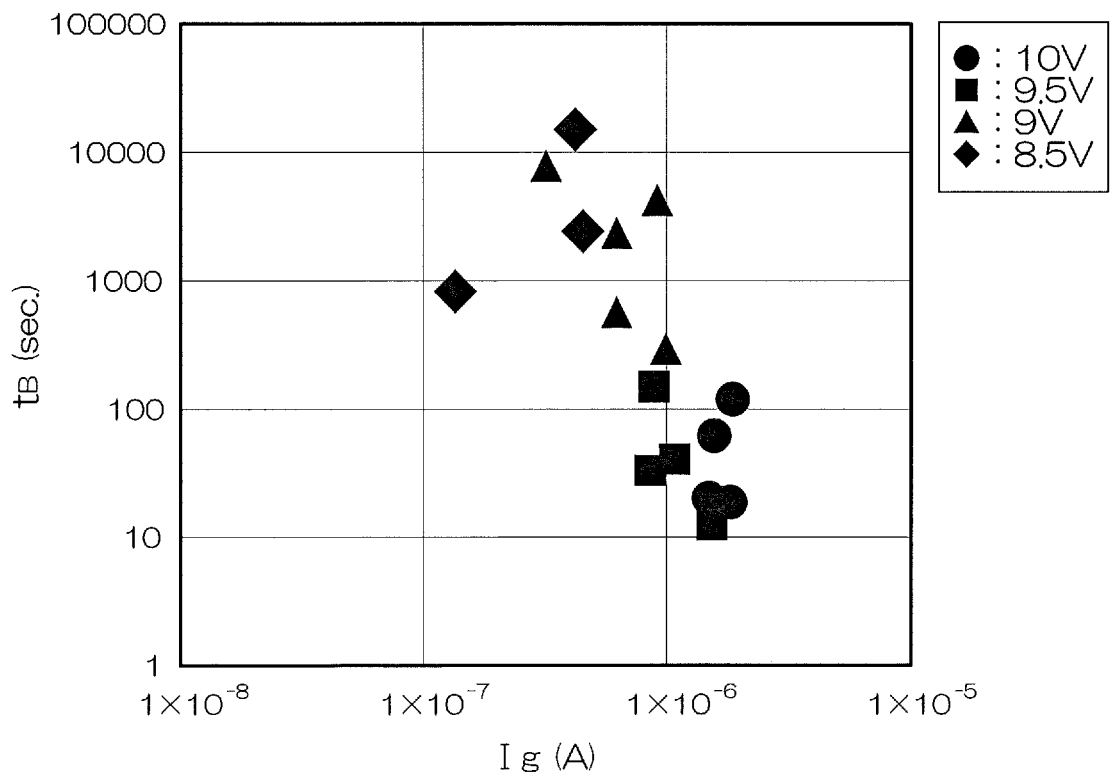
FIG. 25 is a diagram of a relationship of gate current and breakdown time (just Zn).
Figure 26:
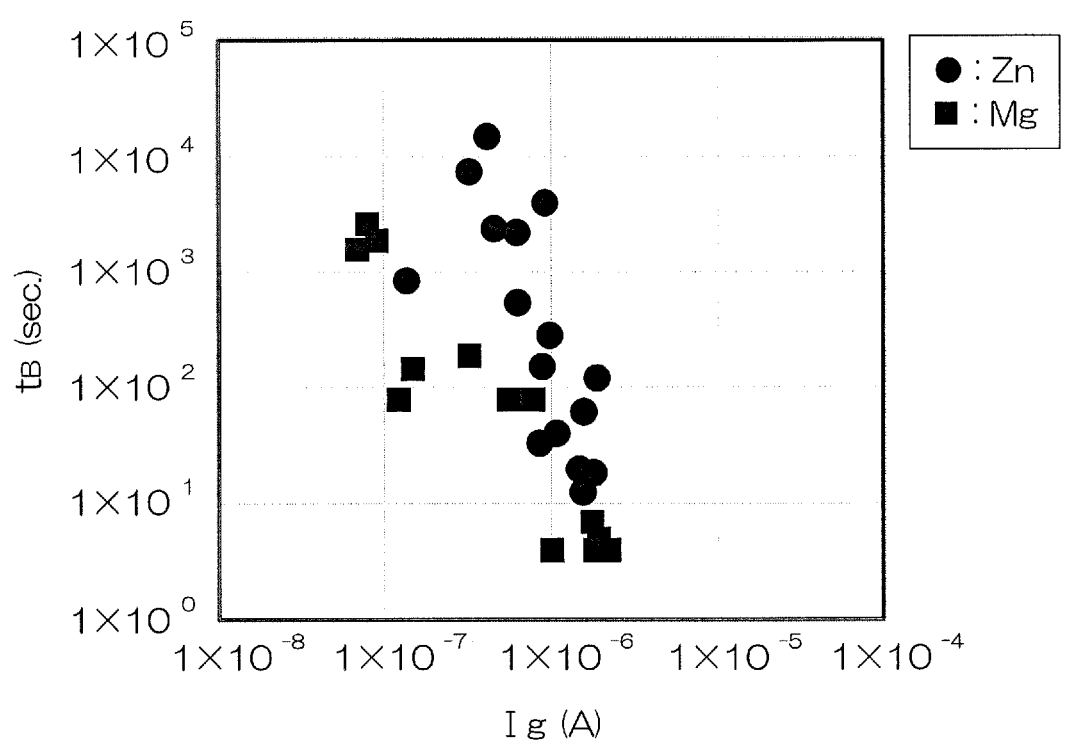
FIG. 26 is a diagram of relationships of the gate current and the breakdown time (comparison of Zn and Mg).
Figure 27:
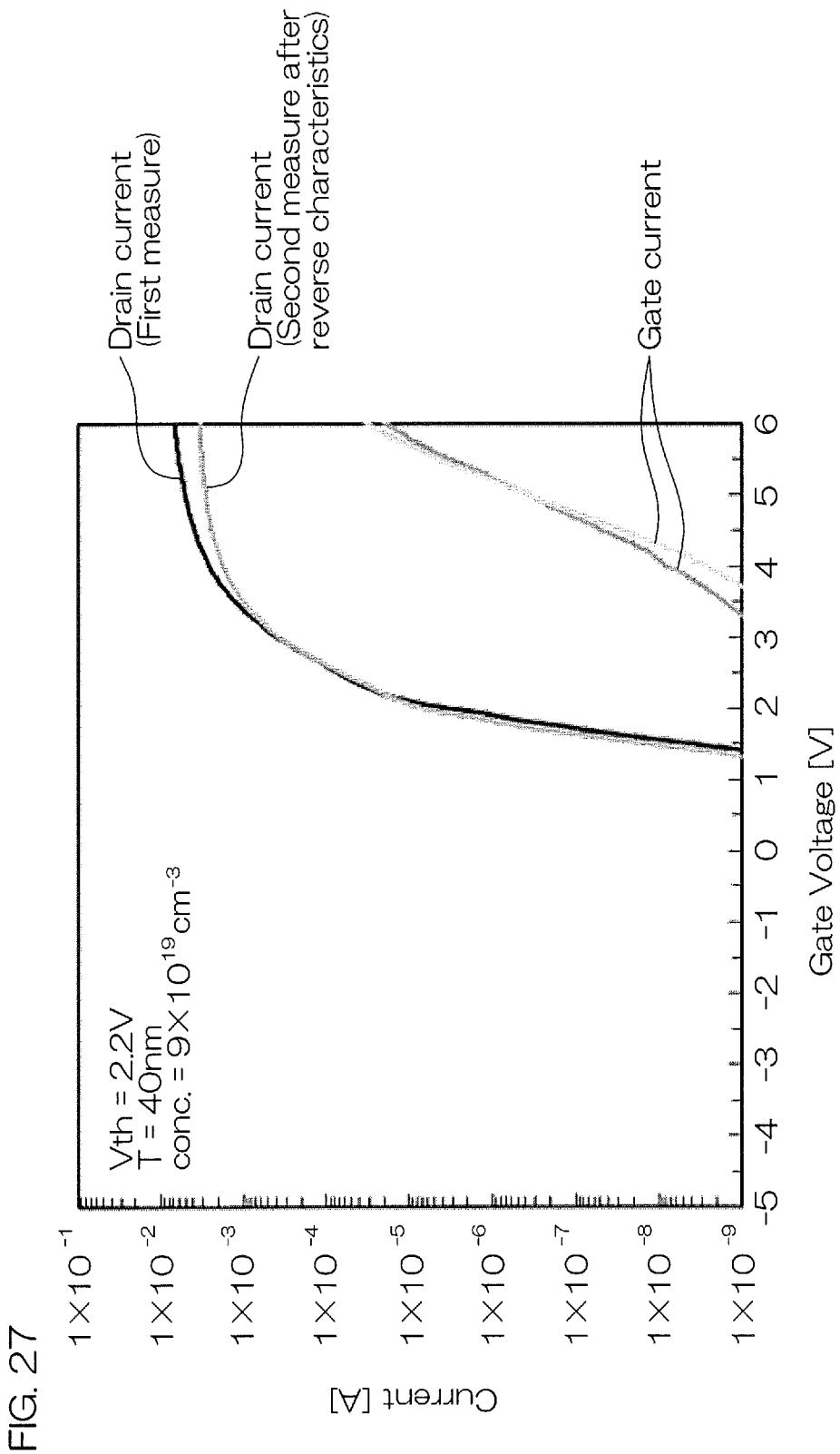
FIG. 27 is a diagram of the Id vs. Vg characteristics of an Mg-doped HEMT.
Figure 28:
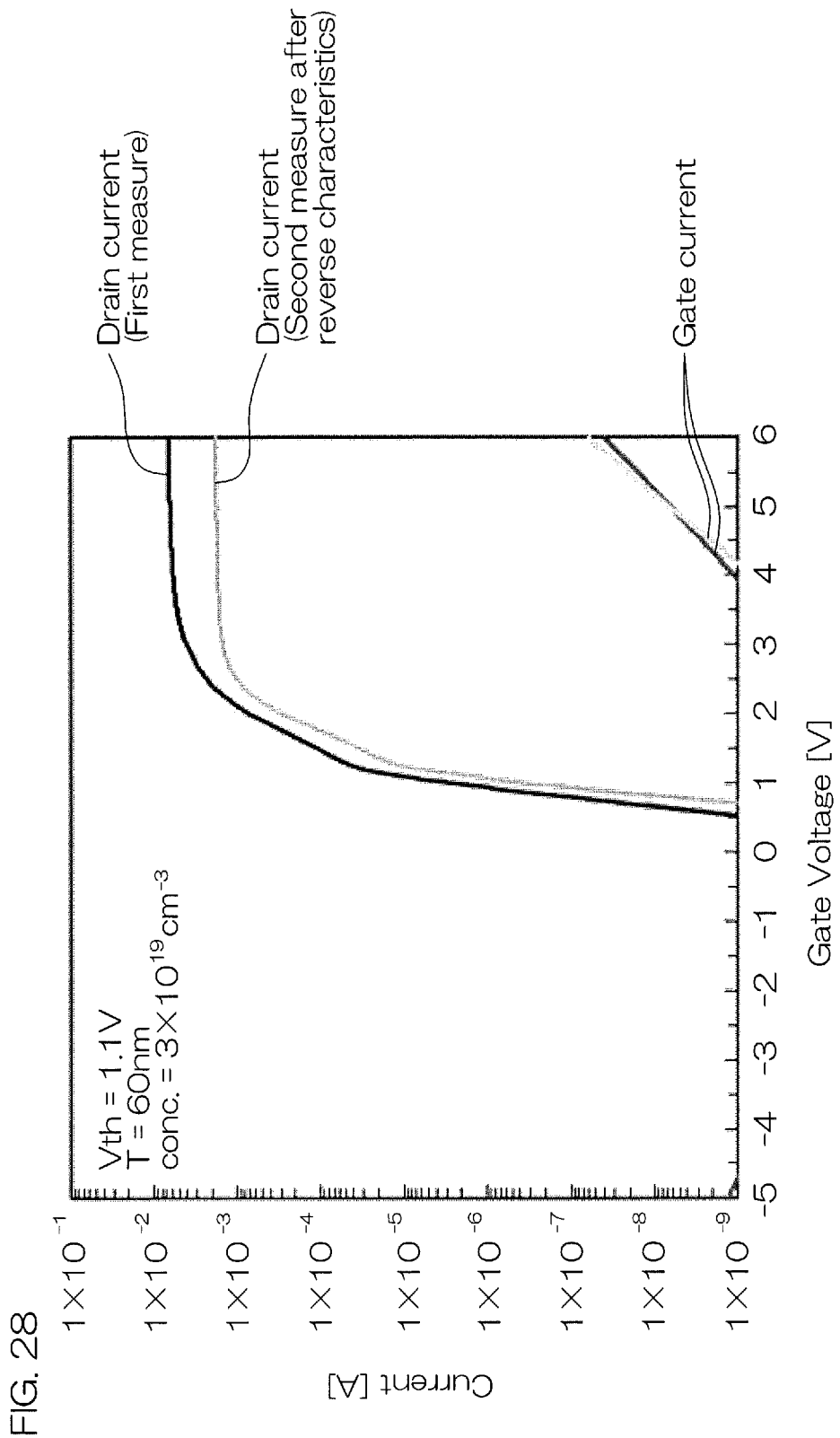
FIG. 28 is a diagram of the Id vs. Vg characteristics of an Mg-doped HEMT.
Figure 29:
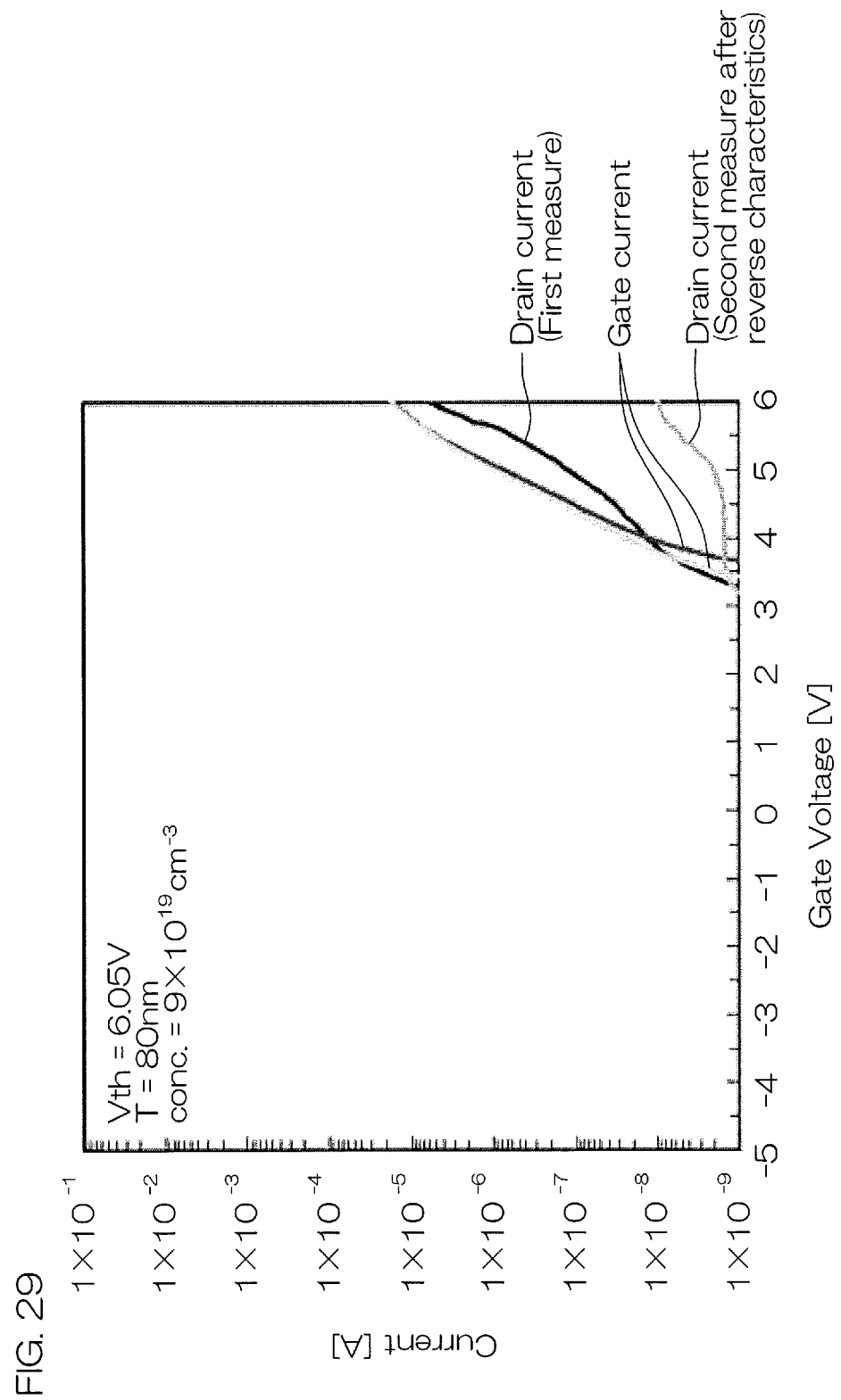
FIG. 29 is a diagram of the Id vs. Vg characteristics of an Mg-doped HEMT.
Figure 30:
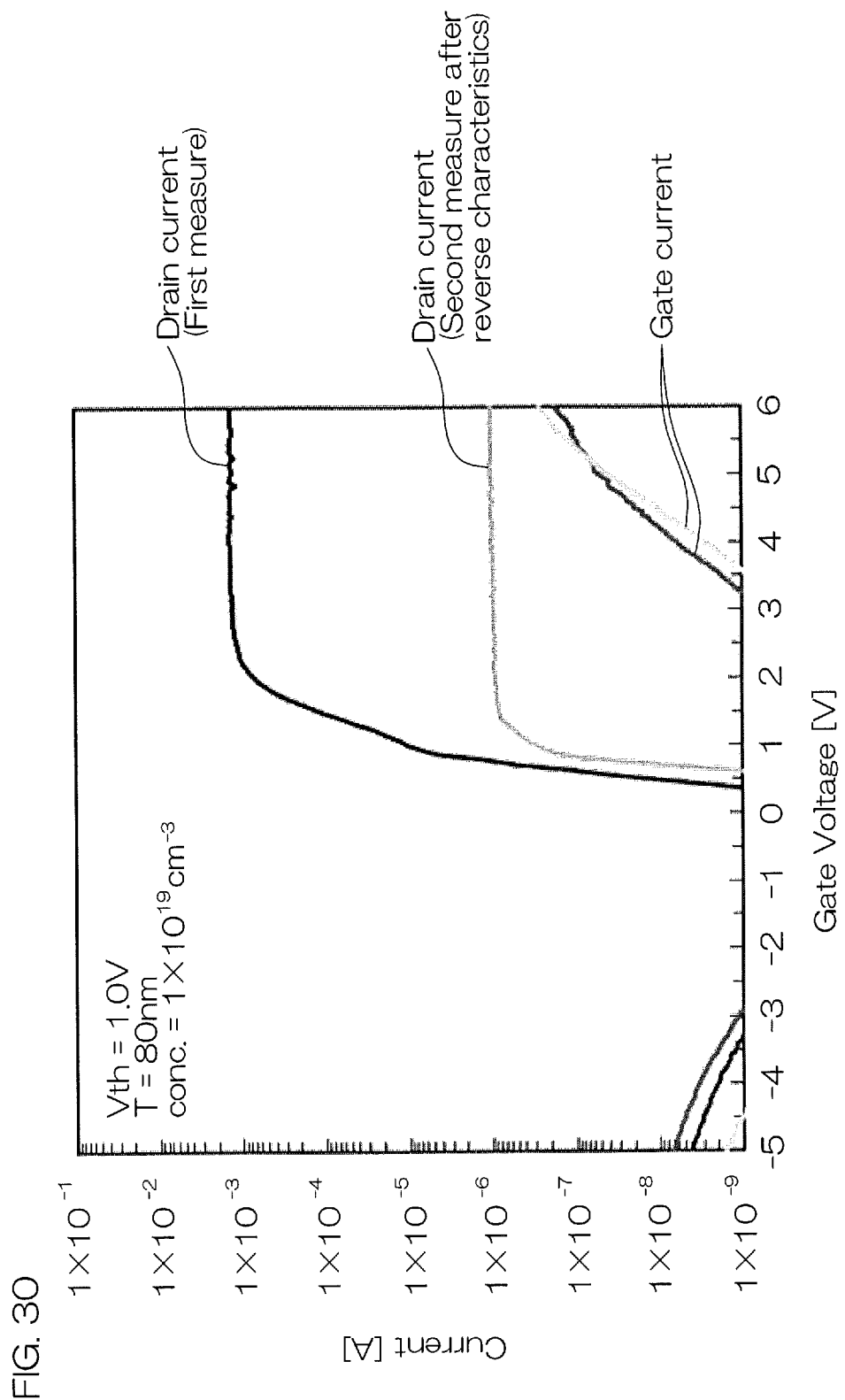
FIG. 30 is a diagram of the Id vs. Vg characteristics of an Mg-doped HEMT.
Figure 31:
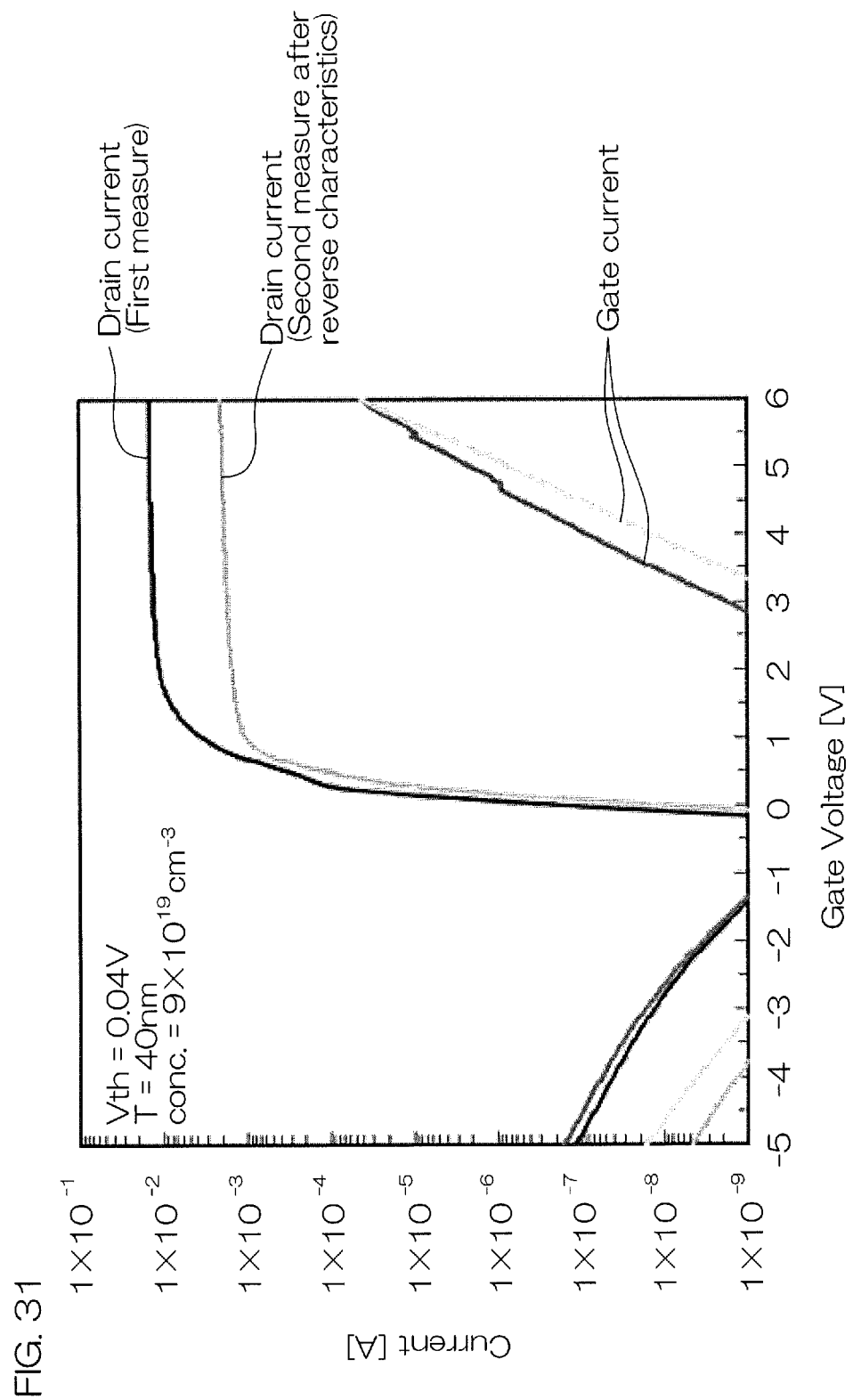
FIG. 31 is a diagram of the Id vs. Vg characteristics of a Zn-doped HEMT.
Figure 32:
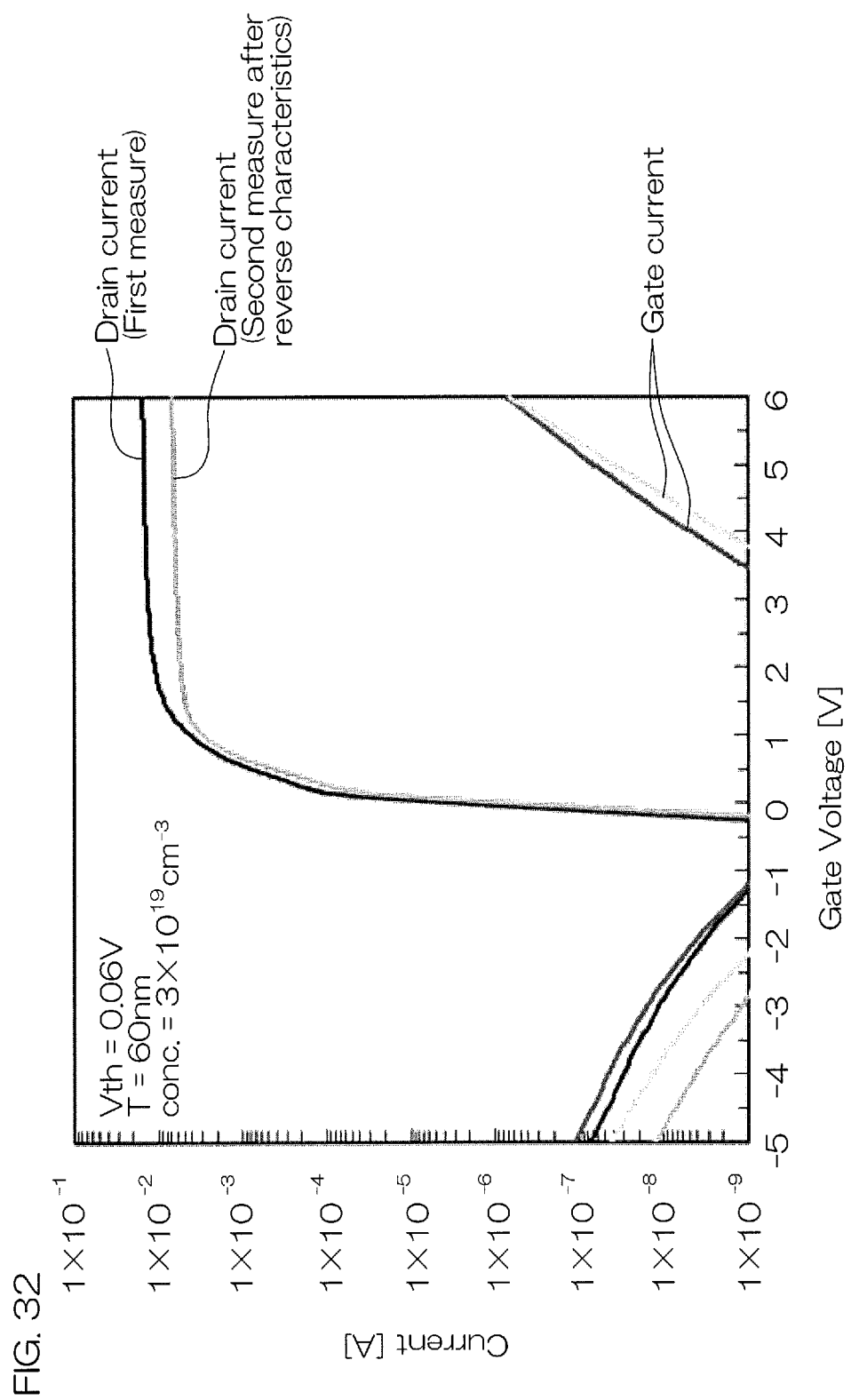
FIG. 32 is a diagram of the Id vs. Vg characteristics of a Zn-doped HEMT.
Figure 33:
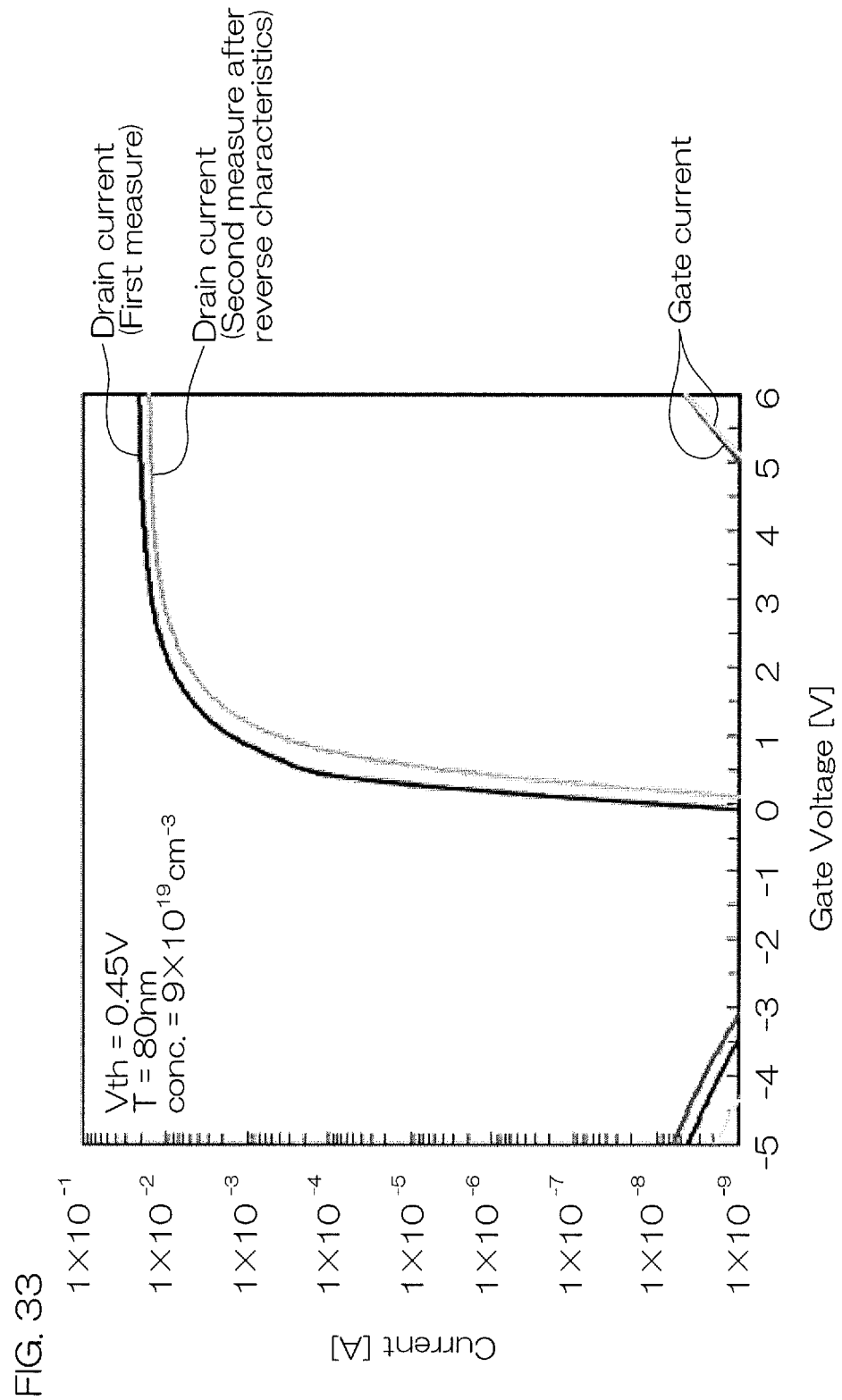
FIG. 33 is a diagram of the Id vs. Vg characteristics of a Zn-doped HEMT.
Figure 34:
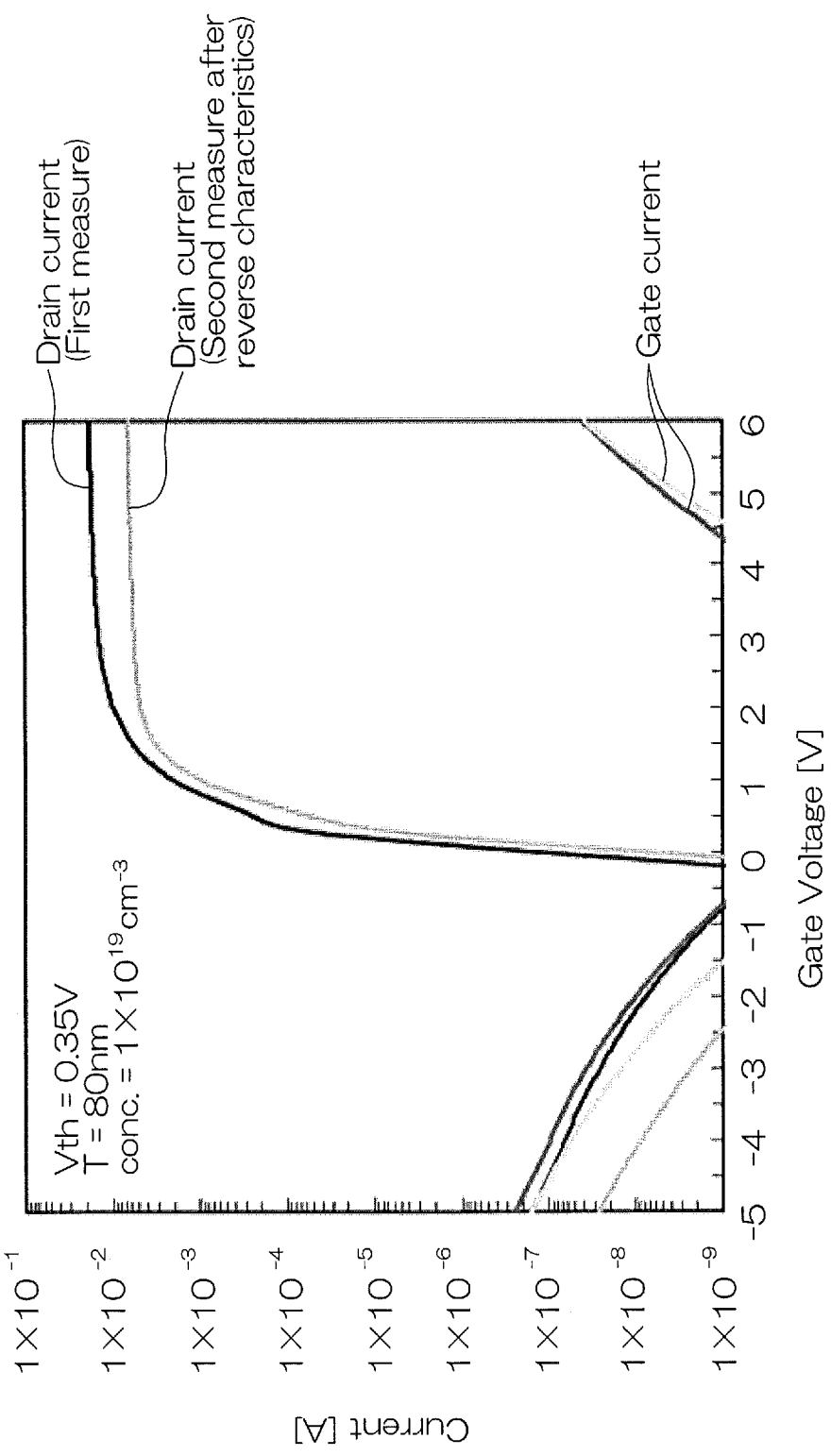
FIG. 34 is a diagram of the Id vs. Vg characteristics of a Zn-doped HEMT.

FIG. 24 is a diagram of results of TDDB measurement of a Zn-doped HEMT. FIG. 25 is a diagram of a relationship of gate current and breakdown time (just Zn). FIG. 26 is a diagram of relationships of the gate current and the breakdown time (comparison of Zn and Mg).

Next, TDDB (time dependent dielectric breakdown) tests were performed on HEMTs that include gate layers 61 respectively of GaN (Zn) and GaN (Mg) to compare which of Zn- and Mg-doped gate layers break down in a short time. Here, the thickness of the gate layer 61 was set to 100 nm and the respective concentrations of Zn and Mg were set to $5\times 10^{19}$ $cm^{-3}$.

As shown in FIG. 24 and FIG. 25, with the Zn-doped HEMT, the gate leak current increases and the time $t_B$ to breakdown of the gate layer 61 shortens as the gate voltage Vg is increased from 8.5 V to 9 V, 9.5 V, and 10 V. Also, as shown in FIG. 26, it can be understood from a comparison of GaN (Zn) and GaN (Mg) that even when a gate leak current of the same magnitude flows, the time $t_B$ to breakdown is shorter for GaN (Mg) than for GaN (Zn). That is, it can be understood from FIG. 24 to FIG. 26 that in order to improve reliability of the gate, it is preferable to adopt the gate layer 61 that contains Zn and further to increase the film thickness of the gate layer 61.

FIG. 27 to FIG. 30 are diagram of the Id vs. Vg characteristics of Mg-doped HEMTs (that include Mg-containing gate layers 61). FIG. 31 to FIG. 34 are diagrams of the Id vs. Vg characteristics of Zn-doped HEMTs (that include Zn-containing gate layers 61).

Next, how the Id vs. Vg characteristics of Mg-doped HEMTs and Zn-doped HEMTs depend on the film thickness of the gate layer 61 and Mg or Zn concentration was examined. In measuring the Id vs. Vg characteristics, it was set that Vd=1.0 V and the film thickness of the gate layer 61 and the Mg or Zn concentration were handled as variables. Also, in FIG. 27 to FIG. 34, the gate threshold voltage Vth signifies the voltage at which the drain current becomes $1.0 \times 10^{-4}$ (A).

As shown in FIG. 27 to FIG. 30, with the Mg-doped HEMTs, although the gate leak current is low when the film thickness of the gate layer 61 is 60 nm (FIG. 28), increase in the gate leak current is seen at 40 nm on the thinner side (FIG. 27) and at 80 nm on the thicker side (FIGS. 29 and 30) with respect to the film thickness of the gate layer 61 being 60 nm as the boundary.

Also, although the normally-off operation is achieved generally with all of the Mg-doped HEMTs, in all cases, the gate threshold voltage Vth is not less than 1.0 V and the threshold is comparatively high. Further, when the film thickness of the gate layer 61 is 80 nm and the Mg concentration is $9 \times 10^{19}$ cm$^{-3}$ (FIG. 29), the drain current is not stable at all and function as a device is practically not achieved. From the above, with an Mg-doped HEMT, as long as conditions are that film thickness=60 nm and Mg concentration=$3 \times 10^{19}$ cm$^{-3}$, the gate leak current can be reduced, the Id vs. Vg characteristics are satisfactory, and normally-off operation can also be achieved. However, the conditions are of extremely narrow ranges and also from a standpoint of Mg being low in controllability of the doping profile with respect to GaN as mentioned above, it is considered difficult to mainly adopt Mg in the gate layer 61.

On the other hand, as shown in FIG. 31 to FIG. 34, with Zn-doped HEMTs, the gate leak current can be made comparatively low and the Id vs. Vg characteristics are also satisfactory. Further, within a range in which normally-off operation can be achieved, the gate threshold voltage Vth can be kept low (at not more than 0.45 V in the present evaluations). In particular, at a film thickness of the gate layer 61 of not less than 60 nm, an effect of reducing the gate leak current increases and at a film thickness of 80 nm, the gate leak current can be kept extremely low.

Figure 35:
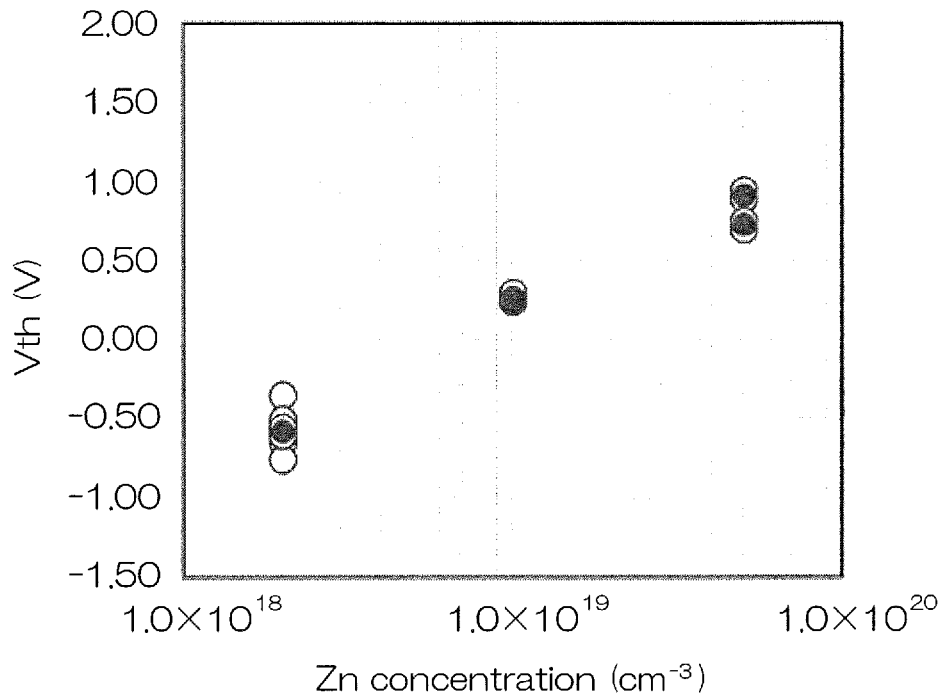
FIG. 35 is a diagram of a relationship of the Zn concentration and the gate threshold voltage.
Figure 36:
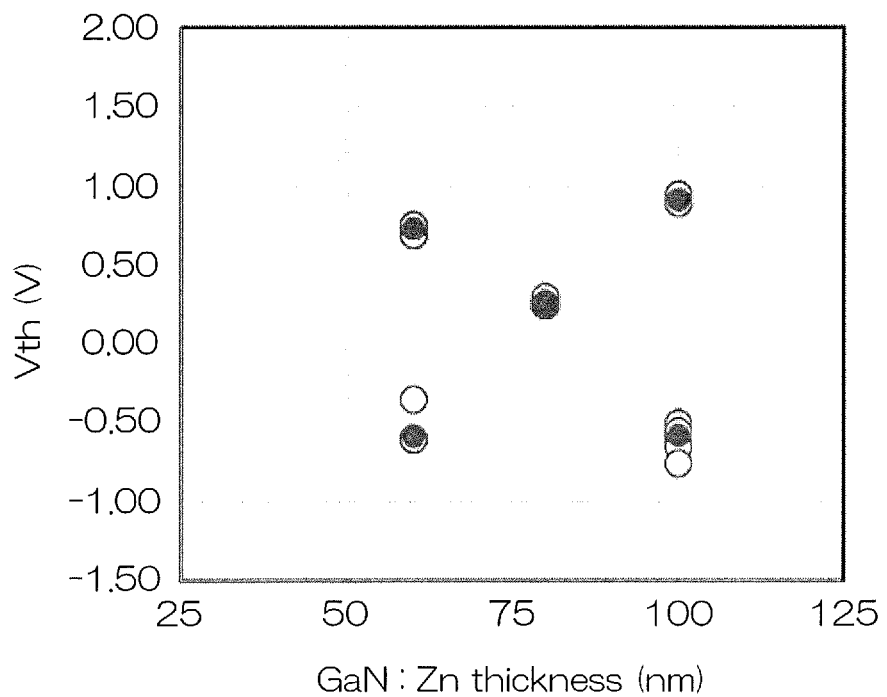
FIG. 36 is a diagram of a relationship of the film thickness of GaN (Zn) and the gate threshold voltage.

FIG. 35 is a diagram of a relationship of the Zn concentration and the gate threshold voltage. FIG. 36 is a diagram of a relationship of the film thickness of GaN (Zn) and the gate threshold voltage.

Next, relationships of the Zn concentration and the film thickness of GaN (Zn) with respect to the gate threshold voltage were also examined. The gate threshold voltage Vth, while increasing with increase in the Zn concentration of the gate layer 61 as shown in FIG. 35, is not correlated with increase/decrease in the film thickness of the gate layer 61 as shown in FIG. 36. From this, it can be understood that the gate threshold voltage is dependent on the Zn concentration but is not dependent on the film thickness of the gate layer 61.

Figure 37:
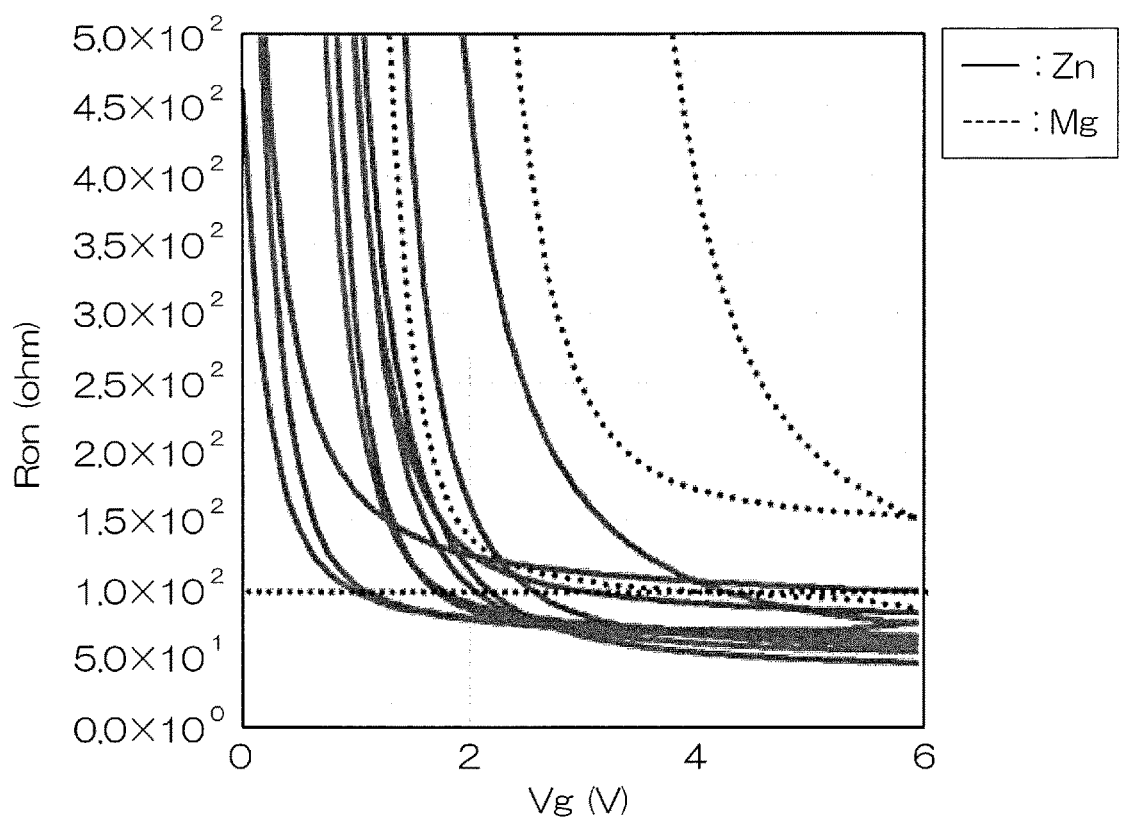
FIG. 37 is a diagram of respective Ron vs. Vg characteristics of Zn-doped HEMTs and Mg-doped HEMTs.
Figure 38:
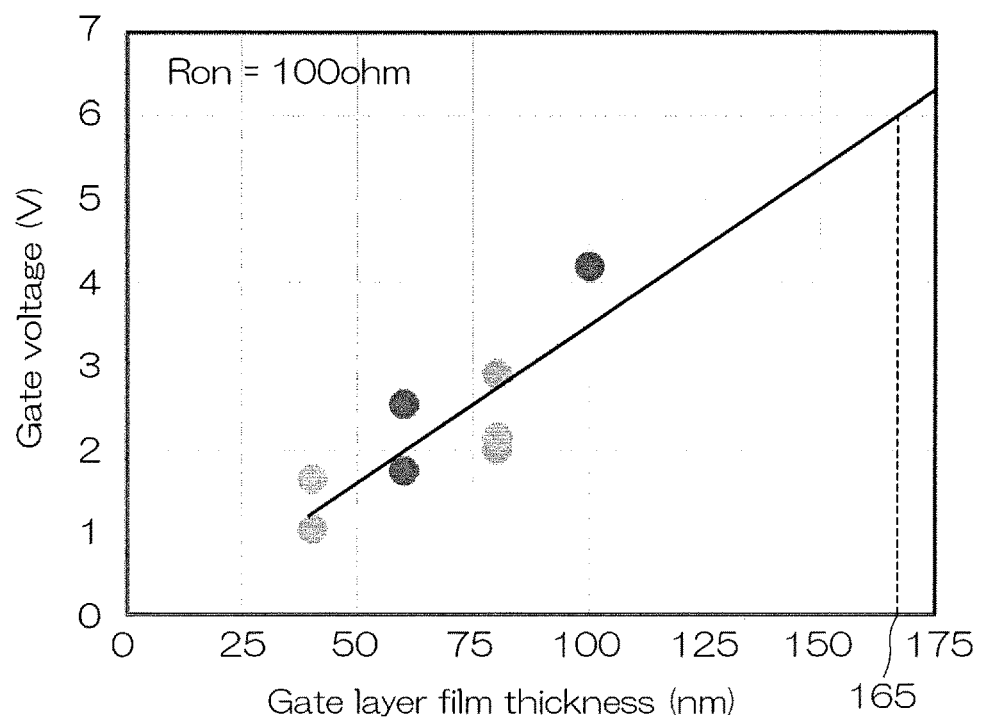
FIG. 38 is a diagram of a relationship of the film thickness of GaN (Zn) and gate application voltage.

FIG. 37 is a diagram of respective Ron vs. Vg characteristics of Zn-doped HEMTs and Mg-doped HEMTs. FIG. 38 is a diagram of a relationship of the film thickness of GaN (Zn) and gate application voltage.

As mentioned above, the effect of reducing the gate leak current became more significant as the film thickness of the gate layer 61 of the Zn-doped HEMT becomes thicker. On the other hand, it was examined whether or not the film thickness of the gate layer 61 influences on resistance.

More specifically, the on-resistance Ron was calculated based on the Id vs. Vg characteristics (for drain voltage Vd=1 V) of a plurality of samples differing in the film thickness of the gate layer 61 and the Mg or Zn concentration. As a result, it can be understood as shown in FIG. 37 that the on resistance of the Zn-doped HEMT decreases with increase in gate voltage and converges to a substantially constant value without dependence on the film thickness of the gate layer 61 and the Zn concentration. Here, dependence of the gate voltage on the film thickness of the gate layer 61 was examined while making note of the point that on resistance Ron=100 ohm.

As a result, the correlation shown in FIG. 38 was obtained. From FIG. 38, it can be understood that with increase in the thickness of the gate layer 61, the gate voltage at which the on resistance Ron of 100 ohm can be obtained increases. For example, a GaN-HEMT with which the electron transit layer 8 is GaN is generally put in operation at gate voltage=approximately 6 V. Therefore, the on resistance at a gate voltage must be kept at not more than 100 ohm. From FIG. 38, it can be understood that if the film thickness of the gate layer 61 is not more than 165 nm, the on resistance Ron of the HEMT can be kept at not more than 100 ohm. Based on this, together with the results of FIG. 31 to FIG. 34, a range of 60 nm to 165 nm is appropriate for the film thickness of the gate layer 61.

Thus, if the gate layer 61 that contains Zn is included as in the nitride semiconductor device 60 according to the present preferred embodiment, the gate leak current can be reduced and satisfactory normally-off operation can be achieved.

Also, by setting the thickness of the gate layer 61 within an appropriate range, the on resistance Ron can also be kept low.

Although with the present preferred embodiment, the effect of introducing the gate layer 61 that contains Zn was described using the HEMT that does not include the first impurity layer 7, there is no problem even if the first impurity layer 7 is included. Rather, by including the first impurity layer 7, the effects indicated using FIG. 1 to FIG. 14 can also be achieved in addition to the effects due to introducing the gate layer 61 that contains Zn.

Also, from the contents of the present preferred embodiment, features such as the following can be extracted besides the invention described in the claims.

(1)

A nitride semiconductor device including
an electron transit layer,
an electron supply layer formed on the electron transit layer,
a gate electrode formed on the electron transit layer,
a gate layer formed between the electron supply layer and the gate electrode and made of a nitride semiconductor containing Zn as an impurity, and a source electrode and a drain electrode formed such that the source electrode and the drain electrode sandwich the gate electrode and electrically connected to the electron supply layer.

(2)

The nitride semiconductor device according to (1), where a thickness of the gate layer is not less than 60 nm and a Zn concentration of the gate layer is not less than $1\times10^{19}$ cm$^{-3}$.

(3)

The nitride semiconductor device according to (2), where the thickness of the gate layer is 60 nm to 165 nm.

(4)

The nitride semiconductor device according to (2) or (3), where the thickness of the gate layer is not less than 80 nm.

Although the preferred embodiments of the present invention were described above, the present invention can be implemented in other modes.

For example, although with the preferred embodiments described above, Zn was given as an example of the impurity contained in the first impurity layer 7 and the second impurity layer 51, there is no restriction in particular as long as the impurity is that with which the depth of the acceptor level from the valence band ($E_T$-$E_V$) is made not less than 0.3 eV but less than 0.6 eV.

Besides the above, various design changes can be applied within the scope of the matters described in the claims.

The present application corresponds to Japanese Patent Application No. 2017-253202 filed on Dec. 28, 2017 in the Japan Patent Office, and the entire disclosure of this application is incorporated herein by reference.

REFERENCE SIGNS LIST 1 nitride semiconductor device
2 (substrate) first surface
3 (substrate) second surface
4 substrate
5 semiconductor laminated structure
6 buffer layer
7 first impurity layer
8 electron transit layer
9 electron supply layer
10 cap layer
11 first side
12 second side
13 third side
14 fourth side
15 source electrode film
16 gate electrode film
17 drain electrode film
20 region
21 front surface insulating film
22 source pad
23 gate pad
24 drain pad
25 opening
26 opening
27 opening
28 interface
29 two-dimensional electron gas
30 recess
31 wall surface
32 bottom surface
33 insulating layer
34 gate electrode
35 second insulating layer
36 source contact hole
37 drain contact hole
38 source electrode
39 drain electrode
40 (source electrode) lower layer
41 (source electrode) upper layer
42 (drain electrode) lower layer
43 (drain electrode) upper layer
44 active region
50 nitride semiconductor layer
51 second impurity layer
52 contact layer
53 wall surface
54 mesa laminated portion
55 extension portion
60 nitride semiconductor device
61 gate layer

The invention claimed is:

1. A nitride semiconductor device comprising:
a first impurity layer made of an Al$_{1-X}$Ga$_X$N (0<X≤1) based material and containing a first impurity with which a depth of an acceptor level from a valence band ($E_T$-$E_V$) is made not less than 0.3 eV but less than 0.6 eV;
an electron transit layer formed on the first impurity layer;
an electron supply layer formed on the electron transit layer;
a second impurity layer made of an Al$_{1-X}$Ga$_X$N (0<X≤1) based material formed on the electron supply layer and containing Zn as a second impurity with which the depth of the acceptor level from the valence band ($E_T$-$E_V$) is made not less than 0.3 eV but less than 0.6 eV;
a nitride semiconductor layer that is undoped and is formed on the second impurity layer;
an insulating layer in contact with the undoped nitride semiconductor layer on the second impurity layer;
a gate electrode formed on the undoped nitride semiconductor layer on the second impurity layer; and
a source electrode and a drain electrode formed such that the source electrode and the drain electrode sandwich the gate electrode and electrically connect to the electron supply layer.

2. The nitride semiconductor device according to claim 1, wherein a hole emission time is not more than 1 s.

3. The nitride semiconductor device according to claim 1, wherein the electron transit layer includes a nitride semiconductor layer that is undoped.

4. The nitride semiconductor device according to claim 3, wherein the undoped nitride semiconductor layer of the electron transit layer includes a layer made of an Al$_{1-X}$Ga$_X$N (0<X≤1) based material that is undoped.

5. The nitride semiconductor device according to claim 1, wherein the electron transit layer has a thickness of not more than 0.3 μm.

6. The nitride semiconductor device according to claim 1, wherein a concentration of the first impurity is decreased by one order of magnitude at a thickness of not more than 0.05 μm to an electron transit layer side from an interface between the first impurity layer and the electron transit layer.

7. The nitride semiconductor device according to claim 1, wherein the first impurity is Zn.

8. The nitride semiconductor device according to claim 7, wherein a Zn concentration of the first impurity layer is $5\times10^{17}$ cm$^{-3}$ to $5\times10^{19}$ cm$^{-3}$ and the first impurity layer contains C at a concentration of less than $5\times10^{17}$ cm$^{-3}$.

9. The nitride semiconductor device according to claim 1, comprising:
a recess formed to selectively penetrate through the electron supply layer such that the recess reaches the electron transit layer; and
an insulating layer formed inside the recess; and
wherein the gate electrode is formed on the insulating layer such that the gate electrode faces the electron transit layer exposed to the recess.

10. The nitride semiconductor device according to claim 9, wherein the insulating layer is an SiN film.

11. The nitride semiconductor device according to claim 9, wherein the electron supply layer is an AlN layer and the nitride semiconductor device further comprises: a cap layer made of GaN laminated on the AlN layer.

12. The nitride semiconductor device according to claim 1, further comprising: a mesa laminated portion having a wall surface extending over the undoped nitride semiconductor layer on the second impurity layer and the second impurity layer; and
wherein the electron supply layer includes an extension portion extending in a direction intersecting a direction of lamination of the mesa laminated portion with respect to the mesa laminated portion and the source electrode and the drain electrode are connected to the extension portion.

13. The nitride semiconductor device according to claim 1, wherein a Zn concentration of the second impurity layer is $5 \times 10^{17}$ cm$^{-3}$ to $5 \times 10^{19}$ cm$^{-3}$.

14. The nitride semiconductor device according to claim 13, wherein the undoped nitride semiconductor layer on the second impurity layer includes a layer made of an $Al_{1-X}Ga_XN$ ($0<X\leq1$) based material that is undoped and a Zn concentration is not more than $5 \times 10^{16}$ cm$^{-3}$.

15. The nitride semiconductor device according to claim 1, further comprising: a gate layer formed between the electron supply layer and the gate electrode and being made of a nitride semiconductor containing Zn as an impurity.

16. The nitride semiconductor device according to claim 15, wherein a thickness of the gate layer is not less than 60 nm and a Zn concentration of the gate layer is not less than $1 \times 10^{19}$ cm$^{-3}$.

17. The nitride semiconductor device according to claim 16, wherein the thickness of the gate layer is 60 nm to 165 nm.

18. The nitride semiconductor device according to claim 16, wherein the thickness of the gate layer is not less than 80 nm.

\* \* \* \* \*